(12) United States Patent
Takenaga et al.

(10) Patent No.: US 7,773,408 B2
(45) Date of Patent: Aug. 10, 2010

(54) NONVOLATILE MEMORY DEVICE

(75) Inventors: Takashi Takenaga, Tokyo (JP);
Takeharu Kuroiwa, Tokyo (JP);
Taisuke Furukawa, Tokyo (JP);
Masakazu Taki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 250 days.

(21) Appl. No.: 12/085,664

(22) PCT Filed: Nov. 17, 2006

(86) PCT No.: PCT/JP2006/322943
§ 371 (c)(1),
(2), (4) Date: May 29, 2008

(87) PCT Pub. No.: WO2007/063718
PCT Pub. Date: Jun. 7, 2007

(65) Prior Publication Data
US 2009/0273965 A1 Nov. 5, 2009

(30) Foreign Application Priority Data
Nov. 30, 2005 (JP) ............................. 2005-345462

(51) Int. Cl.
*G11C 11/00* (2006.01)
(52) U.S. Cl. .................... 365/158; 365/173; 365/148
(58) Field of Classification Search ................ 365/158, 365/148, 173
See application file for complete search history.

(56) References Cited

U.S. PATENT DOCUMENTS 7,405,958 B2 * 7/2008 Okazawa ................... 365/66

2005/0219767 A1 10/2005 Nakamura et al.
2006/0133136 A1 * 6/2006 Iwata ......................... 365/158

FOREIGN PATENT DOCUMENTS

| JP | 2005-505889 | 2/2005 |
| JP | 2005-203702 | 7/2005 |
| JP | 2005-294376 | 10/2005 |
| WO | WO 03/034437 A2 | 4/2003 |
| WO | WO 2006/062150 A1 | 6/2006 |

OTHER PUBLICATIONS

Chen, E.Y., et al., :"Submicron spin valve magnetoresistive random access memory cell", J. Appl. Physics, Apr. 15, 1997, pp. 3992-3994, vol. 81 No. 8, American Institute of Physics.

(Continued)

*Primary Examiner*—Huan Hoang
(74) *Attorney, Agent, or Firm*—McDermott Will & Emery LLP

(57) ABSTRACT

Ferromagnetic layers have magnetizations oriented to such directions as to cancel each other, so that the net magnetization of the ferromagnetic layers is substantially zero. That is, the ferromagnetic layers are exchange-coupled with a nonmagnetic layer interposed therebetween, thereby forming an SAF structure. Since the net magnetization of the ferromagnetic layers forming the SAF structure is substantially zero, the magnetization of a recording layer is determined by the magnetization of a ferromagnetic layer. Therefore, the ferromagnetic layer is made of a CoFeB alloy having high uniaxial magnetic anisotropy, and the ferromagnetic layers are made of a CoFe alloy having a high exchange-coupling force.

11 Claims, 13 Drawing Sheets

OTHER PUBLICATIONS

Inomata, K., et al., "Size-independent spin switching field using synthetic antiferromagnets", Applied Physics Letter, Apr. 21, 2003, pp. 2667-2669, vol. 82 No. 16, American Institute of Physics.

Tezuka, N., et al., "Magnetization reversal and domain structure of antiferromagnetically coupled submicron elements", Journal of Applied Physics, May 15, 2003, pp. 7441-7443, Vo. 93 No. 10, American Institute of Physics.

* cited by examiner

NONVOLATILE MEMORY DEVICE

RELATED APPLICATIONS

This application is the U.S. National Phase under 35 U.S.C. §371 of International Application No. PCT/JP2006/322943, filed on Nov. 17, 2006, which in turn claims the benefit of Japanese Application No. 2005-345462, filed on Nov. 30, 2005, the disclosures of which Applications are incorporated by reference herein.

TECHNICAL FIELD

The present invention relates to a nonvolatile memory device, and more particularly to a random access memory including a magnetoresistive element with a spin valve structure.

BACKGROUND ART

Recently, an MRAM (Magnetic Random Access Memory) device has attracted attention as a new generation nonvolatile memory device. The MRAM device is a nonvolatile memory device storing data in a nonvolatile manner with a plurality of memory cells including magnetic thin films formed on a semiconductor integrated circuit, and allowing random access to each of the memory cells.

Generally, such a memory cell includes a magnetoresistive element with a spin valve structure in which a pinned layer made of a ferromagnetic layer having a pinned magnetization direction and a recording layer made of a ferromagnetic layer having a magnetization direction changed according to an external magnetic field are arranged with a nonmagnetic layer interposed therebetween. The magnetoresistive element with the spin valve structure stores data to correspond to a change in an electric resistance value generated in response to a change in the magnetization direction of the recording layer. Changes in an electric resistance value are classified into the tunnel magnetoresistive effect, the giant magnetoresistive effect, and the like, according to the principles thereof. It has been known that using a magnetoresistive element utilizing the tunnel magnetoresistive effect drastically improves the performance of the MRAM device.

Most magnetoresistive elements are formed to have magnetic anisotropy such that the magnetization direction of the recording layer is parallel or antiparallel to the magnetization direction of the pinned layer, and binary values "0" and "1" are stored to correspond to the magnetization direction of the recording layer. A direction parallel or antiparallel to the magnetization direction of the pinned layer as described above is referred to as an easy axis of magnetization of the recording layer, and a direction orthogonal to the easy axis of magnetization is referred to as a hard axis of magnetization. Specifically, the magnetization direction of the recording layer is switched alternately on the easy axis of magnetization according to an external magnetic field. Such a characteristic by which the magnetization direction of the recording layer is oriented to either direction on the easy axis of magnetization is referred to as uniaxial magnetic anisotropy. Uniaxial magnetic anisotropy is implemented by shape anisotropy caused by lengthening an in-plane shape of the magnetoresistive element along the easy axis of magnetization.

When an MRAM device is formed of memory cells including such magnetoresistive elements, two types of write lines are arranged in rows and columns, and a memory cell is arranged at a position adjacent to each intersection of the two types of write lines. Each memory cell is arranged to be subjected to an external magnetic field in the direction of the easy axis of magnetization and an external magnetic field in the direction of the hard axis of magnetization generated by currents flowing through the two types of write lines, respectively. The magnetoresistive element constituting the memory cell switches the magnetization direction of the recording layer alternately according to a synthetic magnetic field generated by the external magnetic field in the direction of the easy axis of magnetization and the external magnetic field in the direction of the hard axis of magnetization. The orientation and the magnitude of the synthetic magnetic field switching the magnetization direction of the recording layer as described above are referred to as asteroid characteristics, and defined by the magnitudes of the external magnetic field in the direction of the easy axis of magnetization and the external magnetic field in the direction of the hard axis of magnetization. Specifically, in the MRAM device, any one of a plurality of memory cells arranged in rows and columns is specified by appropriately selecting the two types of write lines adjacent to a specific memory cell and passing currents therethrough, thus implementing random access.

It has been known that a magnetic field required to switch the magnetization direction of the recording layer (hereinafter also referred to as a switching magnetic field) is determined by the shape of the recording layer, and is substantially inversely proportional to the width of the recording layer in an in-plane direction and proportional to the thickness of the recording layer, as disclosed in "Submicron spin valve magnetoresistive random access memory cell" by E. Y. Chen et al., Journal of Applied Physics, vol. 81, No. 8, pp. 3992-3994, 15 Apr. 1997 (Non-Patent Document 1). Therefore, when an attempt is made to further miniaturize a memory cell to implement a further highly integrated MRAM device, the width in the in-plane direction is to be reduced and the switching magnetic field is to be increased, causing an increase in power consumption during data write. Accordingly, the recording layer is formed into a thin film to suppress the increase in power consumption during data write. However, forming the recording layer into a thin film has limitations, which may be a factor inhibiting the implementation of a further highly integrated MRAM device.

Consequently, a magnetoresistive element having the same length in the direction of the easy axis of magnetization and in the direction of the hard axis of magnetization and thus having no shape anisotropy to suppress an increase in the switching magnetic field has been proposed for example in "Size-independent spin switching field using synthetic antiferromagnets" by K. Inomata et al., Applied Physics Letters, vol. 82, No. 16, pp. 2667-2669, 21 Apr. 2003 (Non-Patent Document 2), and "Magnetization reversal and domain structure of antiferromagnetically coupled submicron elements" by N. Tezuka et al., Journal of Applied Physics, vol. 93, No. 10, pp. 7441-7443, 15 May 2003 (Non-Patent Document 3). To implement uniaxial magnetic anisotropy in such a magnetoresistive element without shape anisotropy, it has been proposed to employ an antiparallel coupling structure (i.e., Synthesis Anti-Ferromagnetic structure; hereinafter also referred to as an SAF structure) including two ferromagnetic layers exchange-coupled in an antiparallel manner with a nonmagnetic layer interposed therebetween.

Non-Patent Document 1: "Submicron spin valve magnetoresistive random access memory cell" by E. Y. Chen et al., Journal of Applied Physics, vol. 81, No, 8, pp. 3992-3994, 15 Apr. 1997

Non-Patent Document 2: "Size-independent spin switching field using synthetic antiferromagnets" by K. Inomata et al., Applied Physics Letters, vol. 82, No. 16, pp. 2667-2669, 21 Apr. 2003

Non-Patent Document 3: "Magnetization reversal and domain structure of antiferromagnetically coupled submicron elements" by N. Tezuka et al., Journal of Applied Physics, vol. 93, No. 10, pp. 7441-7443, 15 May 2003.

DISCLOSURE OF THE INVENTION

Problems to be Solved by the Invention

To exert the effect of suppressing the magnitude of the switching magnetic field as described above, it is necessary to employ an SAF structure having a high exchange-coupling force between the ferromagnetic layers. However, among practical ferromagnetic materials having a high exchange-coupling force, a ferromagnetic material capable of implementing uniaxial magnetic anisotropy in the same level as conventional uniaxial magnetic anisotropy obtained by using shape anisotropy has not been found.

Specifically, a ferromagnetic material having a high exchange-coupling force has low uniaxial magnetic anisotropy, and thus the magnetization direction of the recording layer is likely to be oriented to a direction other than the easy axis of magnetization. As a result, affected by an external magnetic field, the magnetoresistive element is caused to have an electric resistance value that is an intermediate value other than a value corresponding to "0" or "1".

In the MRAM device described above, when access to a specific memory cell is performed, a magnetic field is also applied to other memory cells arranged along the same write line as the memory cell. Therefore, when memory cells including magnetoresistive elements having low uniaxial magnetic anisotropy are used, the magnetization direction of the recording layer is changed every time when access to other memory cells is performed, causing a problem that stored data becomes unstable.

Consequently, the present invention has been made to solve the aforementioned problem, and one object of the present invention is to provide a nonvolatile memory device including a magnetoresistive element having a low-magnitude switching magnetic field in a recording layer and high uniaxial magnetic anisotropy.

Means for Solving the Problems

According to an aspect of the present invention, a nonvolatile memory device includes a plurality of write lines provided in rows and columns, and a magnetoresistive element arranged to correspond to an intersection of two write lines corresponding to a row and a column among the plurality of write lines. The magnetoresistive element stores data by being subjected to a write magnetic field generated by currents flowing through the respective two write lines according to write data, and changing an electric resistance value in a nonvolatile manner. The magnetoresistive element includes a pinned layer having a fixed magnetization direction irrespective of the write magnetic field, a recording layer having a magnetization direction changeable according to the write magnetic field, and a first nonmagnetic layer sandwiched between the pinned layer and the recording layer. Further, the recording layer includes an exchange-coupling layer, a first ferromagnetic layer made of a first material, and a second nonmagnetic layer sandwiched between the exchange-coupling layer and the first ferromagnetic layer. The exchange-coupling layer includes second and third ferromagnetic layers made of a second material different from the first material, and a third nonmagnetic layer sandwiched between the second ferromagnetic layer and the third ferromagnetic layer. The second and the third ferromagnetic layers have magnetizations oriented opposite to each other and substantially identical in magnitude to cancel each other.

EFFECTS OF THE INVENTION

According to the invention in accordance with the aspect, the magnetoresistive element includes a pinned layer having a fixed magnetization direction and a recording layer having a magnetization direction changed according to the write magnetic field, and the recording layer includes an exchange-coupling layer and a first ferromagnetic layer made of a first material. Further, the exchange-coupling layer includes second and third ferromagnetic layers made of a second material that have magnetizations canceling each other. Therefore, a material for the first ferromagnetic layer contributing to uniaxial magnetic anisotropy of the recording layer and a material for the second and the third ferromagnetic layers forming the exchange-coupling layer can be determined independently. Consequently, by selecting a material having high uniaxial magnetic anisotropy as the first material and selecting a material having a high exchange-coupling force as the second material, a nonvolatile memory device including a magnetoresistive element having a low-magnitude switching magnetic field in a recording layer and high uniaxial magnetic anisotropy can be implemented.

DESCRIPTION OF THE REFERENCE SIGNS

Figure 1:
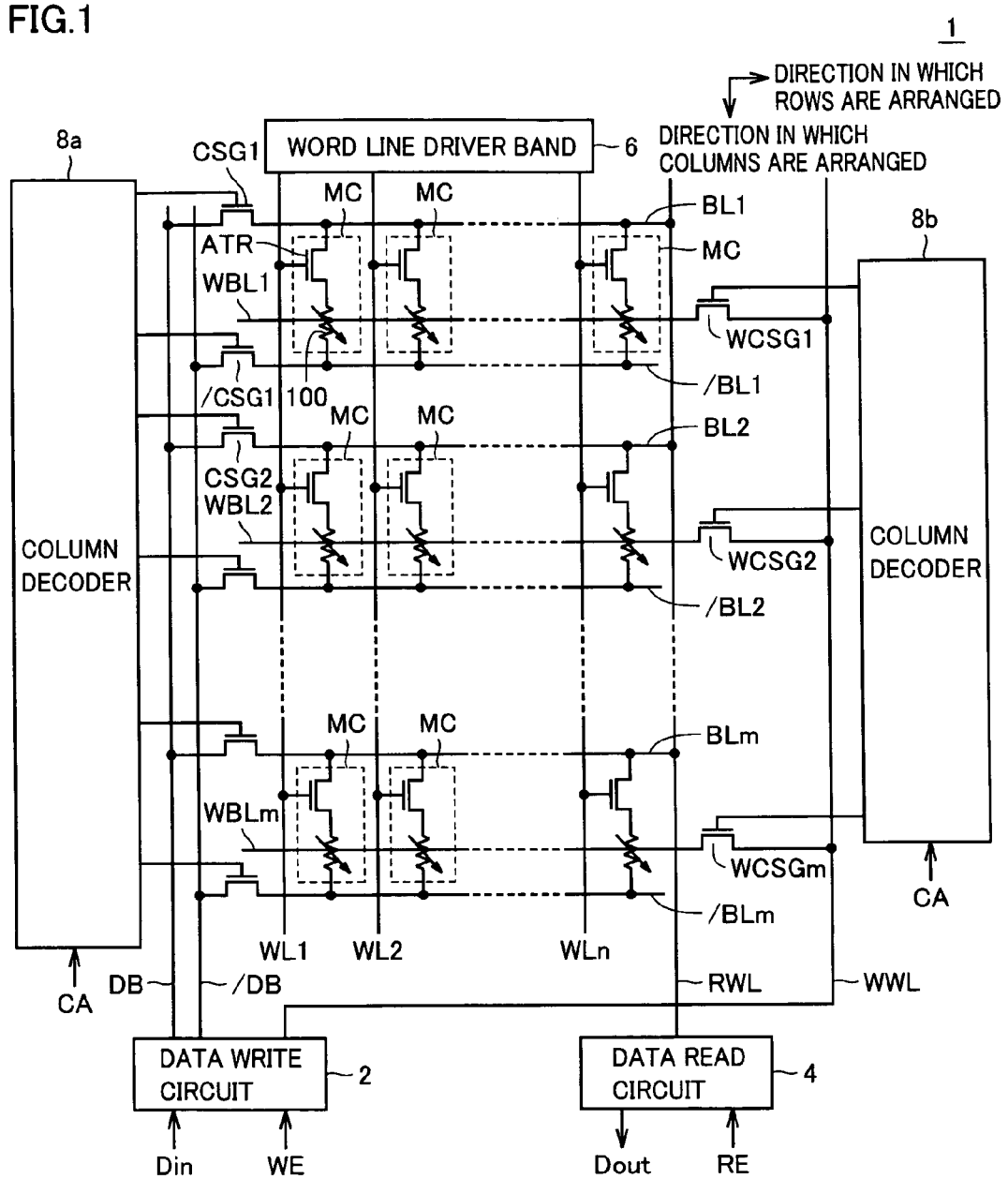
FIG. 1 is an entire configuration diagram of an MRAM device, a typical example of a nonvolatile memory device in accordance with a first embodiment of the present invention.

1: MRAM device, 2: data write circuit, 4: data read circuit, 6: word line driver band, 8a, 8b: column decoder, 10: antiferromagnetic layer, 12, 14, 18, 18.1, 18.2, 22, 26: ferromagnetic layer, 16, 20, 20.1, 20.2, 24, 28: nonmagnetic layer, 40: semiconductor substrate, 42: interlayer insulating film, 44: copper wire, 46: barrier metal, 48: conductive layer, 50.1, 50.2, 50.3: contact plug, 52: gate insulating film, 54b: side wall, 54s: source region, 54d: drain region, 56: contact hole, 60, 62: unsaturated range, 100, 101, 102, 103, 104: tunnel junction element, ATR: access transistor, BAL: tunnel insulating layer, BL1 and /BL1 to BLm and /BLm: bit line pair, CSG1 and /CSG1 to CSGm and /CSGm: column selection gate pair, DB, /DB: data line, Din: input data, Dout: output data, H(Ib), H(Iw): external magnetic field, H: synthetic magnetic field, Hc: coercivity, Hl: maximum magnetic field, Hsw: switching magnetic field, Ib: bit line current, Iw: write line current, MC: memory cell, PL: pinned layer, RL: recording layer, RWL: read word line, WBL1 to WBLm: write bit line, WCSG1 to WCSGm: write column selection gate, WL1 to WLn: word line, WWL: write data line.

BEST MODES FOR CARRYING OUT THE INVENTION

Hereinafter, embodiments of the present invention will be described in detail with reference to the drawings, in which identical or corresponding parts will be designated by the same reference numerals, and the description thereof will not be repeated.

First Embodiment

FIG. 1 shows an entire configuration of an MRAM device 1, a typical example of a nonvolatile memory device in accordance with a first embodiment of the present invention.

Referring to FIG. 1, MRAM device 1 performs random access in response to a control signal and an address signal supplied externally, and performs writing of input data Din and reading of output data Dout. Data write operation and data read operation in MRAM device 1 are performed for example at a timing in synchronization with an external clock signal. Operation timing may be determined internally without receiving an external clock signal.

MRAM device 1 has a memory array including memory cells MC arranged in n rows and m columns (n, m: natural number).

In the memory array, bit line pairs BL1 and /BL1 to BLm and /BLm each having two complementary bit lines, and write bit lines WBL1 to WBLm are arranged corresponding to respective memory cell columns. Word lines WL1 to WLn are arranged corresponding to respective memory cell rows.

Hereinafter, characters BL and /BL, BL (/BL), WBL, and WL will be used to generically indicate the bit line pair, the bit line, the write bit line, and the word line, respectively. Further, binary high voltage state and low voltage state of a signal, a signal line, data, or the like, will be referred to as an "H" level and an "L" level, respectively.

Each memory cell MC includes a tunnel junction element 100, which is a magnetoresistive element utilizing the tunneling effect, and an access transistor ATR connected in series with tunnel junction element 100. Memory cell MC is connected to bit line pair BL and /BL of a corresponding memory cell column. Access transistor ATR constituting memory cell MC has a gate connected to word line WL of a corresponding memory cell row.

MRAM device 1 further includes a word line driver band 6 connected to word lines WL. During data write and data read (hereinafter also simply referred to as data access), word line driver band 6 selectively activates word line WL corresponding to memory cell MC for which data access is to be performed, according to a row selection result.

MRAM device 1 further includes complementary data lines DB and /DB for transmitting write data and read data, and a write data line WWL for transmitting write data. Further, MRAM device 1 also includes column selection gate pairs CSG1 and /CSG1 to CSGm and /CSGm and write column selection gates WCSG1 to WCSGm provided corresponding to respective memory cell rows, a read word line RWL, column decoders 8a and 8b, a data write circuit 2, and a data read circuit 4.

Hereinafter, characters CSG and /CSG, CSG (/CSG), and WCSG will be used to generically indicate the column selection gate pair, the column selection gate, and the write column selection gate, respectively.

Column decoder 8a selectively activates either one or both of the two complementary column selection gates CSG and /CSG during each of data write and data read, according to a result of decoding a column address CA, that is, a column selection result. As a result, the activated column selection gates CSG and /CSG electrically couple data lines DB and /DB to corresponding bit lines BL and /BL, respectively.

Similarly, column decoder 8b selectively activates write column selection gate WCSG during data write, according to the result of decoding column address CA, that is, the column selection result. As a result, the activated write column selection gate WCSG electrically couples write data line WWL to corresponding write bit line WBL.

Read word line RWL connects each bit line BL to data read circuit 4.

Data write circuit 2 is externally supplied with a write enable signal WE and input data Din, and applies a prescribed voltage to data line pairs DB and /DB and write data line WWL.

Data read circuit 4 is externally supplied with a read enable signal RE, amplifies a voltage on read word line RWL using a sense amplifier, compares the amplified voltage with a voltage value of a reference resistor not shown, and outputs output data Dout based on a comparison result.

(Data Write Operation)

Word line driver band 6 activates word line WL corresponding to a selected memory cell row to an "H" level, to activate access transistors ATR in memory cells MC arranged in the corresponding memory cell row. Then, tunnel junction elements 100 connected in series with the activated access transistors ATR are electrically connected to respective bit line pairs BL and /BL.

At the same time, column decoder 8a activates column selection gate pair CSG and /CSG corresponding to a selected memory cell column to an "H" level, to electrically connect bit line pair BL and /BL corresponding to the memory cell column to data line pair DB and /DB. Similarly, column decoder 8b activates write column selection gate WCSG corresponding to the selected memory cell column to an "H" level, to electrically connect write bit line WBL corresponding to the memory cell column to write data line WWL.

Thereafter, data write circuit 2 applies a prescribed voltage according to input data Din to each of data line pair DB and /DB and data write line WWL. Then, a bit line current is generated to flow through data line DB, column selection gate CSG, bit line BL, memory cell MC, bit line /BL, column selection gate /CSG, and data line /DB, successively. Further, a write line current is generated to flow through write data line WWL, write column selection gate WCSG, and write bit line WBL, successively. Thereby, memory cell MC corresponding to the selected memory cell row and the selected memory cell column is simultaneously subjected to an external magnetic field generated by the bit line current and an external magnetic field generated by the write line current, and the recording layer of tunnel junction element 100 is magnetized in a direction according to input data Din. In this manner, data write is performed on one memory cell MC specified by the memory cell row selected by word line driver band 6 and the memory cell column selected by column selection gate pair CSG and /CSG and write column selection gate WCSG.

In an unselected memory cell MC arranged in the selected memory cell row, the external magnetic field by the write current is generated, whereas the external magnetic field by the bit line current is not generated. Therefore, the magnetization direction of the recording layer of the unselected memory cell MC is not changed.

(Data Read Operation)

Word line driver band 6 activates word line WL corresponding to a selected memory cell row to an "H" level, to activate access transistors ATR in memory cells MC arranged in the corresponding memory cell row. Then, tunnel junction elements 100 connected in series with the activated access transistors ATR are electrically connected to respective bit line pairs BL and /BL.

At the same time, column decoder 8a activates column selection gate /CSG corresponding to a selected memory cell column to an "H" level, to electrically connect bit line /BL corresponding to the memory cell column to data line /DB. Thereafter, data write circuit 2 applies a prescribed reference voltage to data line /DB. Then, a read current is generated to flow through data line /DB, column selection gate /CSG, bit line /BL, memory cell MC, bit line BL, and read word line RWL, successively. Herein, data read circuit 4 senses a value of the current flowing through read word line RWL to detect an electric resistance value of a selected memory cell MC. In this manner, data read is performed on one memory cell MC specified by the memory cell row selected by word line driver band 6 and the memory cell column selected by column selection gate CSG.

Figure 2A:
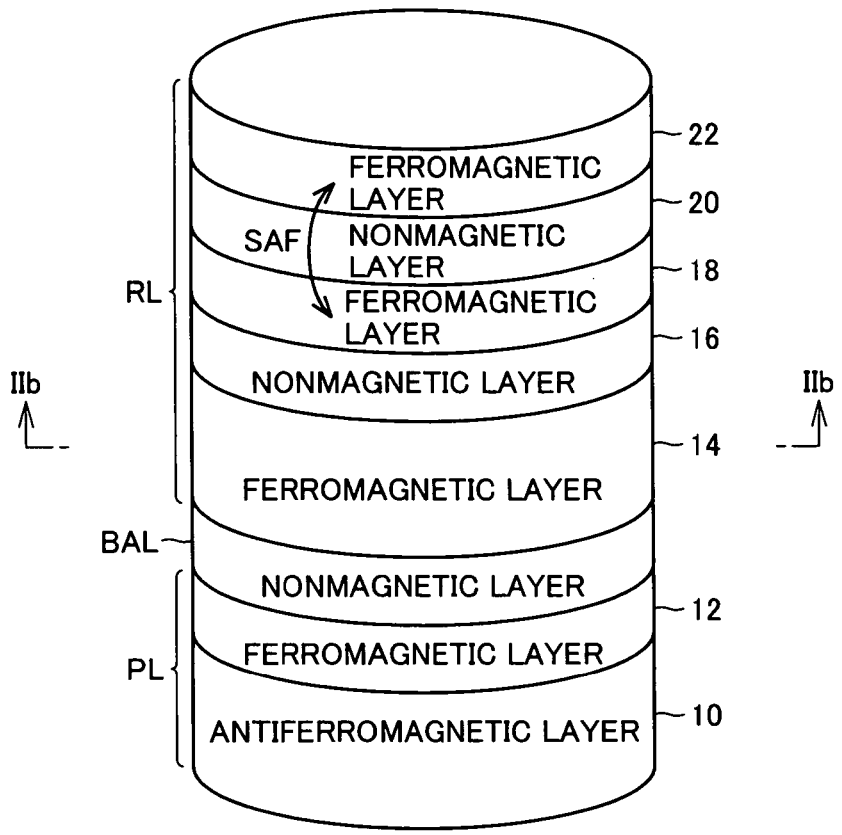
FIG. 2A is an appearance view of a tunnel junction element in accordance with the first embodiment of the present invention.
Figure 2B:
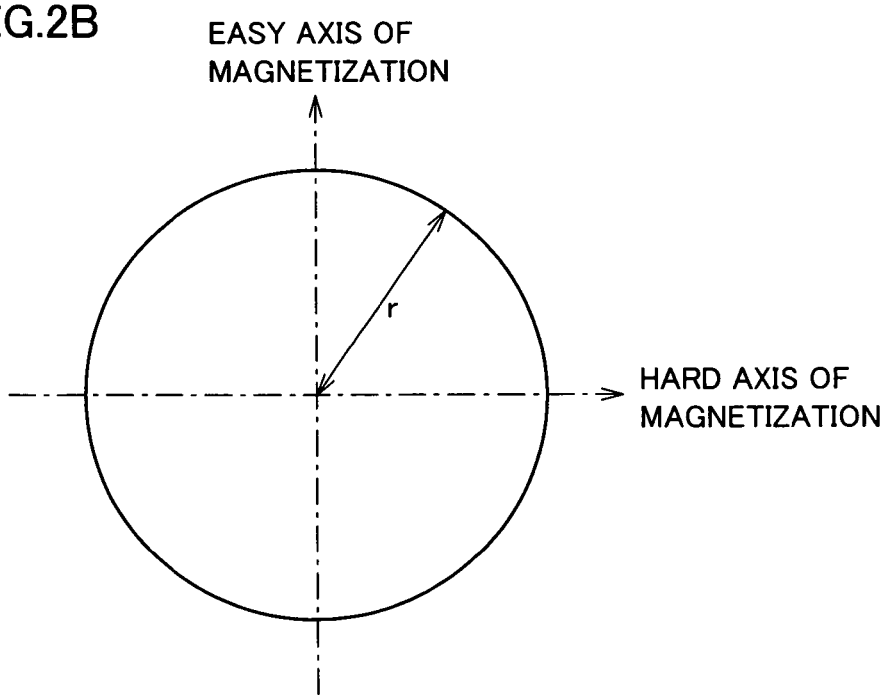
FIG. 2B is a cross sectional view of the tunnel junction element in accordance with the first embodiment of the present invention.

FIGS. 2A and 2B show a schematic configuration of tunnel junction element 100 in accordance with the first embodiment of the present invention.

FIG. 2A shows a schematic appearance of tunnel junction element 100.

FIG. 2B shows a cross section taken along line IIb-IIb in FIG. 2A.

Referring to FIG. 2A, tunnel junction element 100 is formed by stacking a pinned layer PL, a tunnel insulating layer BAL, and a recording layer RL in this order.

Referring to FIG. 2B, in the first embodiment of the present invention, tunnel junction element 100 is in the shape of a cylinder having a circular cross section with a prescribed radius r. As an example, the cross sectional area of tunnel junction element 100 has a radius r of 50 nm.

Referring back to FIG. 2A, pinned layer PL includes an antiferromagnetic layer 10 and a ferromagnetic layer 12, and has a magnetization direction that is pinned irrespective of an external magnetic field. The magnetization direction of the entire pinned layer PL is pinned because antiferromagnetic layer 10 and ferromagnetic layer 12 are exchange-coupled and antiferromagnetic layer 10 pins the spin orientation in ferromagnetic layer 12.

Antiferromagnetic layer 10 is made of, for example, PtMn, FeMn, IrMn, or the like.

Ferromagnetic layer 12 is made of, for example, a metal material containing Co, Fe, Ni, or the like as a main component, such as a CoFe alloy, a Co, Fe or CoNi alloy, a CoFeNi alloy, or the like.

Recording layer RL has a magnetization direction changed according to an external magnetic field. Recording layer RL includes a ferromagnetic layer 14, a nonmagnetic layer 16, a ferromagnetic layer 18, a nonmagnetic layer 20, and a ferromagnetic layer 22.

Ferromagnetic layers 18 and 22 have magnetizations oriented to such directions as to cancel each other, so that the net magnetization of ferromagnetic layers 18 and 22 is substantially zero. Specifically, ferromagnetic layers 18 and 22 are exchange-coupled with nonmagnetic layer 20 interposed therebetween, thereby forming an SAF structure.

Ferromagnetic layers 18 and 22 are each made of a metal material containing Co, Fe, Ni, or the like as a main component, such as a CoFe alloy, a Co, Fe or CoNi alloy, a CoFeNi alloy, or the like. In the first embodiment of the present invention, ferromagnetic layers 18 and 22 are made of a CoFe alloy, for example, and formed to have the same layer thickness. Since ferromagnetic layers 18 and 22 have the same cross sectional area as described above, ferromagnetic layers 18 and 22 have the same volume, and thus have the same magnitude of magnetization. Therefore, in a case where ferromagnetic layers 18 and 22 have magnetizations oriented to directions canceling each other, the net magnetization thereof is substantially zero.

Ferromagnetic layers 18 and 22 and nonmagnetic layer 20 correspond to the "exchange-coupling layer".

Ferromagnetic layer 14 is arranged on a side opposite to ferromagnetic layer 18 with nonmagnetic layer 16 interposed therebetween. Ferromagnetic layer 14 is made of a metal material containing Co, Fe, Ni, or the like as a main component, such as a CoFe alloy, a Co, Fe or CoNi alloy, a CoFeNi alloy, or the like, and also containing B. In the first embodiment of the present invention, ferromagnetic layer 14 is made of a CoFeB alloy, for example.

Since the net magnetization of ferromagnetic layers 18 and 22 forming the SAF structure is substantially zero as described above, the magnetization of recording layer RL is determined by the magnetization of ferromagnetic layer 14.

Specifically, the magnetizations of ferromagnetic layers 18 and 22 forming the SAF structure are switched according to the magnetization direction of ferromagnetic layer 14 in response to an external magnetic field.

Nonmagnetic layers 16 and 20 are made of Ru, Cu, Ta, or the like. In the first embodiment of the present invention, nonmagnetic layer 16 and 20 are made of Ru, for example.

In the first embodiment of the present invention, for example, ferromagnetic layer 14 has a layer thickness of 5 nm, ferromagnetic layers 18 and 22 each have a layer thickness of 2 nm, and nonmagnetic layer 16 and 20 each have a layer thickness of 0.9 nm.

Tunnel insulating layer BAL is made of a nonmagnetic layer, causing the tunneling effect between pinned layer PL and recording layer RL. Since the probability that electrons tunnel through tunnel insulating layer BAL is changed depending on the relative relationship between the magnetization direction of pinned layer PL and the magnetization direction of recording layer RL, the electric resistance value of entire tunnel junction element 100 is changed according to the magnetization of recording layer RL that is changed according to the external magnetic field. Specifically, the minimum electric resistance value is obtained when the magnetization direction of recording layer RL coincides with the magnetization direction of pinned layer PL (i.e., in a parallel state), and the maximum electric resistance value is obtained when the magnetization direction of recording layer RL is opposite to the magnetization direction of pinned layer PL (i.e., in an antiparallel state). Tunnel insulating layer BAL may be any insulator causing the tunneling effect, and is made of AlOx or MgO, for example.

Since tunnel junction element 100 in accordance with the first embodiment of the present invention has a circular cross section as described above, no shape anisotropy is caused in an in-plane direction, and thus it is not possible to implement uniaxial magnetic anisotropy by using shape anisotropy as in a conventional magnetoresistive element. Therefore, tunnel junction element 100 implements uniaxial magnetic anisotropy by using a manufacturing process.

To form ferromagnetic layers 14, 18, and 22, for example, a magnetic field of around 100×1000/4π (A/m) is applied in a direction that is to be an easy axis of magnetization in each plane, and patterning is performed along the direction. Subsequently, the layers of tunnel junction element 100 are formed, and thereafter thermal treatment is performed on recording layer RL and pinned layer PL. Specifically, ferromagnetic layers 14, 18, and 22 and ferromagnetic layer 12 constituting pinned layer PL are held at about 300° C. for around 10 hours, with a magnetic field of around 10×1000/4π (kA/m) saturating the respective ferromagnetic layers applied in the direction that is to be the easy axis of magnetization.

In this manner, tunnel junction element 100 implements uniaxial magnetic anisotropy by performing patterning and thermal treatment.

Figure 3:
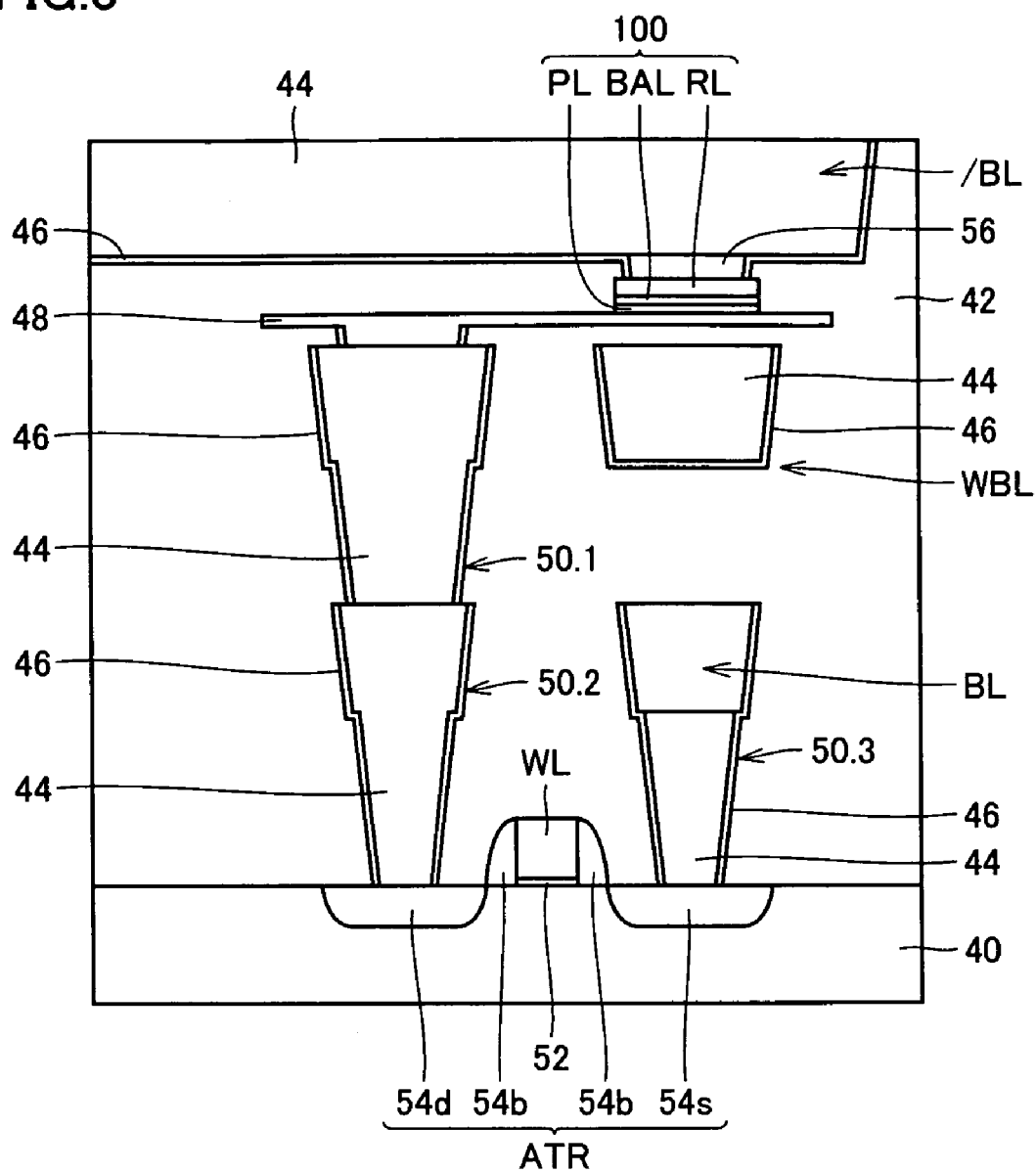
FIG. 3 is a schematic cross sectional view of a memory cell constituting the MRAM device.

FIG. 3 shows a schematic cross section of memory cell MC constituting MRAM device 1.

Referring to FIG. 3, bit line /BL is formed over a semiconductor substrate 40 with an interlayer insulating film 42 formed on semiconductor substrate 40 interposed therebetween. Bit line /BL is formed of a copper wire 44 and a barrier metal 46 formed therearound.

Write bit line WBL is formed in a direction orthogonal to a wiring direction of bit line /BL and between bit line /BL and semiconductor substrate 40. As with bit line /BL, write bit line WBL is also formed of copper wire 44 and barrier metal 46 formed therearound.

Tunnel junction element 100 is formed between a plane on which bit line /BL is formed and a plane on which write bit line WBL is formed. A direction in which the layers are stacked in tunnel junction element 100 coincides with an in-plane direction of semiconductor substrate 40. Further, recording layer RL of tunnel junction element 100 is electrically connected with bit line /BL via a contact hole 56, and pinned layer PL of tunnel junction element 100 is electrically connected with a conductive layer 48.

Conductive layer 48 is connected with semiconductor substrate 40 via contact plugs 50.1 and 50.2 connected in series.

Bit line BL wired in a direction identical to that of write bit line WBL is formed between the plane on which write bit line WBL is formed and semiconductor substrate 40. Further, bit line BL is electrically connected with semiconductor substrate 40 via a contact plug 50.3.

Contact plugs 50.1, 50.2, and 50.3 are each formed of copper wire 44 and barrier metal 46 formed therearound, as with bit line /BL.

Word line WL is arranged on semiconductor substrate 40 with a gate insulating film 52 interposed therebetween. Side walls 54b are formed between semiconductor substrate 40 and both side surfaces of word line WL in a wiring direction thereof. Further, a drain region 54d and a source region 54s are formed in semiconductor substrate 40 about planes connected with contact plugs 50.2 and 50.3, respectively. Specifically, access transistor ATR is formed by drain region 54d, source region 54s, and gate insulating film 52. When word line WL is activated to an "H" level, conductance between drain region 54d and source region 54s is increased to bring access transistor ATR into conduction.

Since tunnel junction element 100 is formed in a layer between bit line /BL and write bit line WBL as described above, it is subjected to an external magnetic field generated by a bit line current flowing through bit line /BL and an external magnetic field generated by a write line current flowing through write bit line WBL. Specifically, since the bit line current flows through bit line /BL in a lateral direction of a paper plane, the magnetic field generated in tunnel junction element 100 by the bit line current is oriented to a direction vertical to the paper plane. On the other hand, since the write line current flows through write bit line WBL in the direction vertical to the paper plane, the magnetic field generated in tunnel junction element 100 by the write line current is oriented to the lateral direction of the paper plane. Therefore, tunnel junction element 100 is arranged such that an easy axis of magnetization and a hard axis of magnetization thereof coincide with the directions in which the magnetic fields are generated, respectively, as described below.

Figure 4:
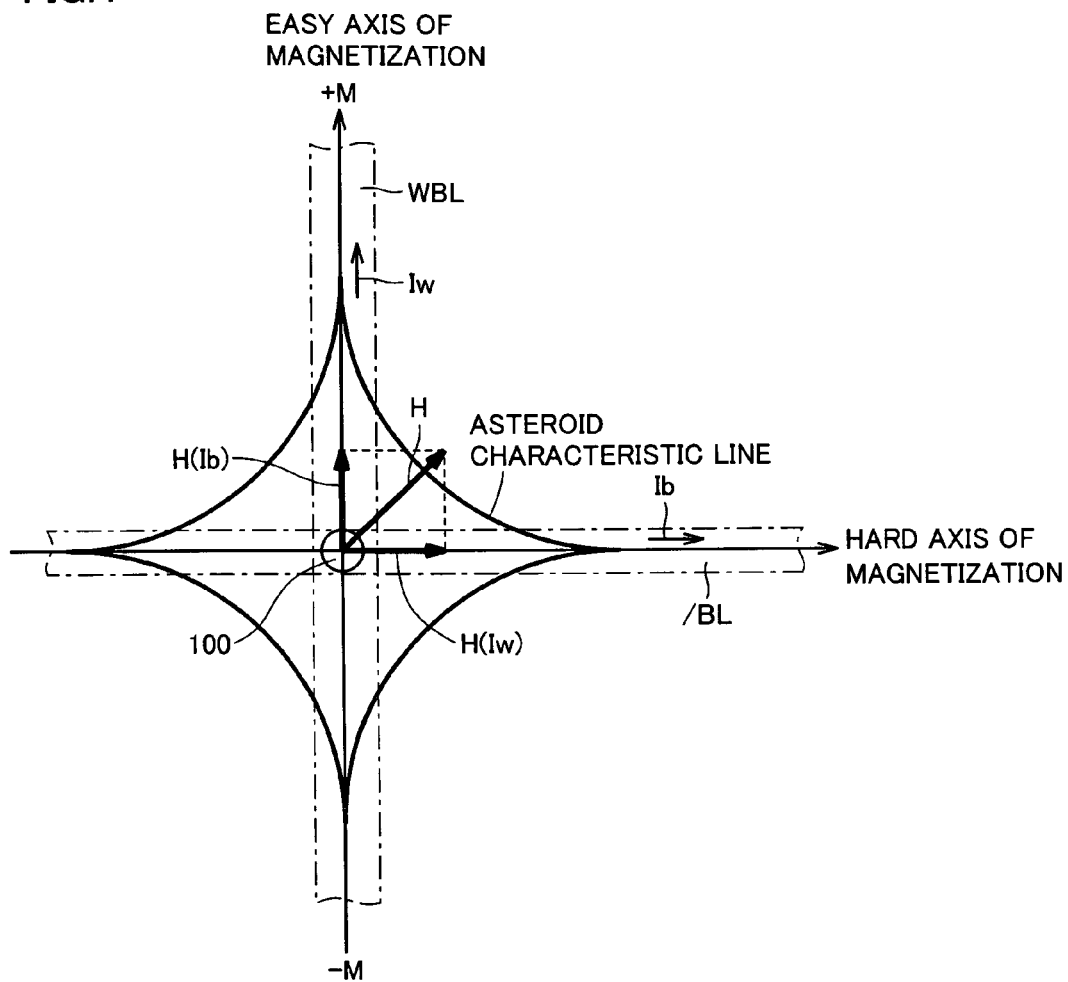
FIG. 4 is a view showing an asteroid characteristic line of the tunnel junction element.

FIG. 4 shows an asteroid characteristic line of tunnel junction element 100.

Referring to FIG. 4, tunnel junction element 100 is spatially arranged such that its center coincides with an intersection of bit line /BL and write bit line WBL in an in-plane direction. The easy axis of magnetization of tunnel junction element 100 coincides with the wiring direction of write bit line WBL, and the hard axis of magnetization thereof coincides with the wiring direction of bit line /BL. Accordingly, tunnel junction element 100 is subjected to an external magnetic field H(Ib) in the direction of the easy axis of magnetization generated by a bit line current Ib flowing through bit line /BL, and an external magnetic field H(Iw) in the direction of the hard axis of magnetization generated by a write line current Iw flowing through write bit line WBL. As a result, tunnel junction element 100 is subjected to a synthetic magnetic field H of external magnetic fields H(Ib) and H(Iw).

If synthetic magnetic field H applied to tunnel junction element 100 is present in an outside region as seen from the central point of the asteroid characteristic line, the magnetization of recording layer RL is changed to either a direction +M or a direction −M on the easy axis of magnetization. Specifically, when synthetic magnetic field H exceeds the asteroid characteristic line on the +M side, the magnetization direction of recording layer RL is changed to direction +M on the easy axis of magnetization, and when synthetic magnetic field H exceeds the asteroid characteristic line on the −M side, the magnetization direction of recording layer RL is changed to direction −M on the easy axis of magnetization.

Figure 5A:
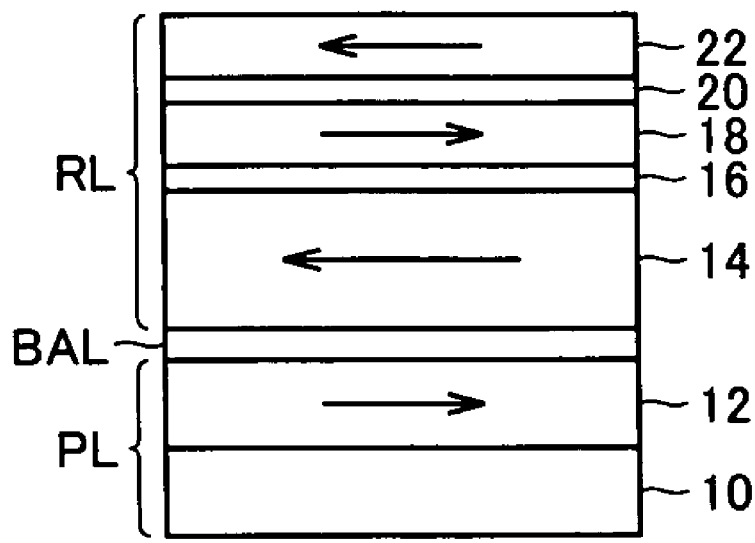
FIG. 5A is a view showing magnetization directions of respective layers when the tunnel junction element stores a value "0".
Figure 5B:
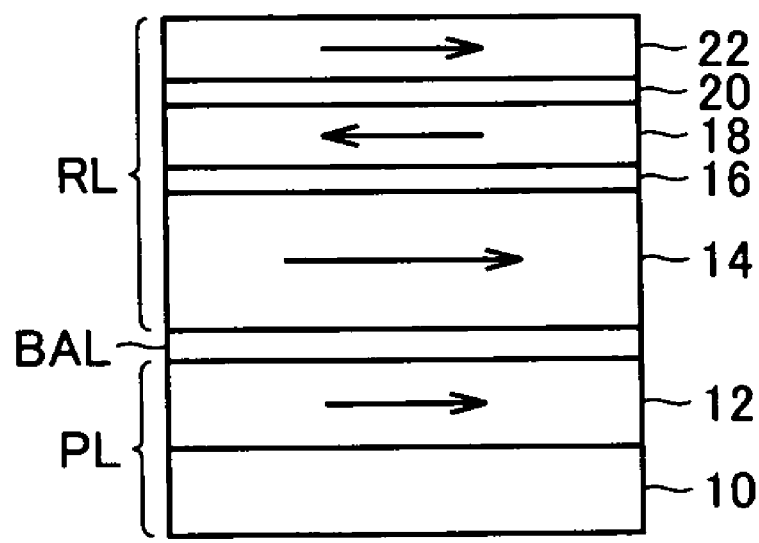
FIG. 5B is a view showing magnetization directions of respective layers when the tunnel junction element stores a value "1".

FIGS. 5A and 5B show magnetization directions of respective layers when tunnel junction element 100 stores data.

FIG. 5A shows a case where a value "0" is stored.

FIG. 5B shows a case where a value "1" is stored.

In the first embodiment of the present invention, the value "0" is stored to correspond to a case where the magnetization direction of recording layer RL is antiparallel (i.e., in a direction opposite) to the magnetization direction of pinned layer PL, that is, where tunnel junction element 100 is in a high resistance state. Further, the value "1" is stored to correspond to a case where the magnetization direction of recording layer RL is parallel (i.e., in a direction identical) to the magnetization direction of pinned layer PL, that is, where tunnel junction element 100 is in a low resistance state.

Referring to FIG. 5A, in the case where tunnel junction element 100 stores the value "0", if the magnetization direction of pinned layer PL is oriented to the right side of the paper plane, the magnetization direction of ferromagnetic layer 14 arranged on a side opposite to pinned layer PL with tunnel insulating layer BAL interposed therebetween is oriented to the left side of the paper plane. The magnetization direction of ferromagnetic layer 18 arranged on a side opposite to ferromagnetic layer 14 with nonmagnetic layer 16 interposed therebetween is oriented to the right side of the paper plane. Further, the magnetization direction of ferromagnetic layer 22 forming the SAF structure together with ferromagnetic layer 18 is oriented to the left side of the paper plane, and the magnitude of the magnetization thereof substantially coincides with the magnitude of the magnetization of ferromagnetic layer 18. Therefore, as the entire recording layer RL, the magnetizations of ferromagnetic layers 18 and 22 cancel each other, and only the magnetization of ferromagnetic layer 14 appears. That is, the magnetization of the entire recording layer RL is substantially identical to the magnetization of ferromagnetic layer 14.

Referring to FIG. 5B, in the case where tunnel junction element 100 stores the value "1", the magnetization directions of ferromagnetic layers 14, 18, and 22 are opposite to the magnetization directions in the above case where the value "0" is stored, respectively. That is, the magnetization directions of ferromagnetic layers 14 and 22 are oriented to the right side of the paper plane, and the magnetization direction of ferromagnetic layer 18 is oriented to the left side of the paper plane. Therefore, as the entire recording layer RL, the magnetization direction thereof is oriented to the right side of the paper plane.

(Characteristic of Recording Layer)

As described above, in the first embodiment of the present invention, ferromagnetic layer 14 constituting recording layer RL is made of a CoFeB alloy, and ferromagnetic layers 18 and 22 forming the SAF structure are each made of a CoFe alloy.

Figure 6A:
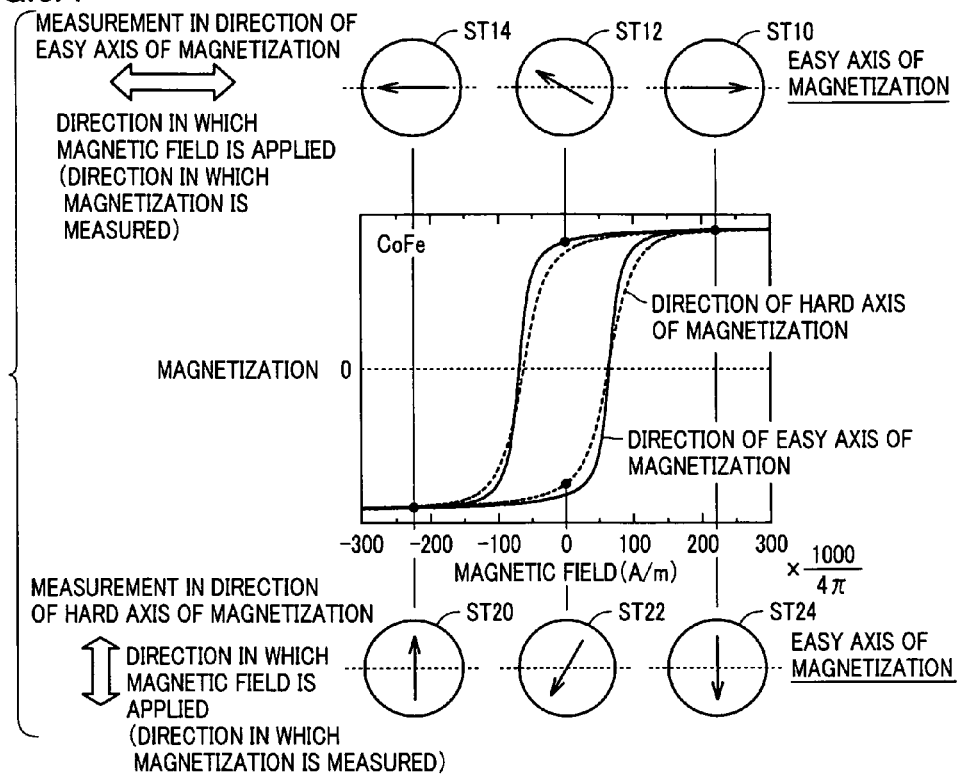
FIG. 6A is a view showing an example of a magnetization characteristic of a CoFe alloy.

FIG. 6A shows an example of a magnetization characteristic of a CoFe alloy.

Figure 6B:
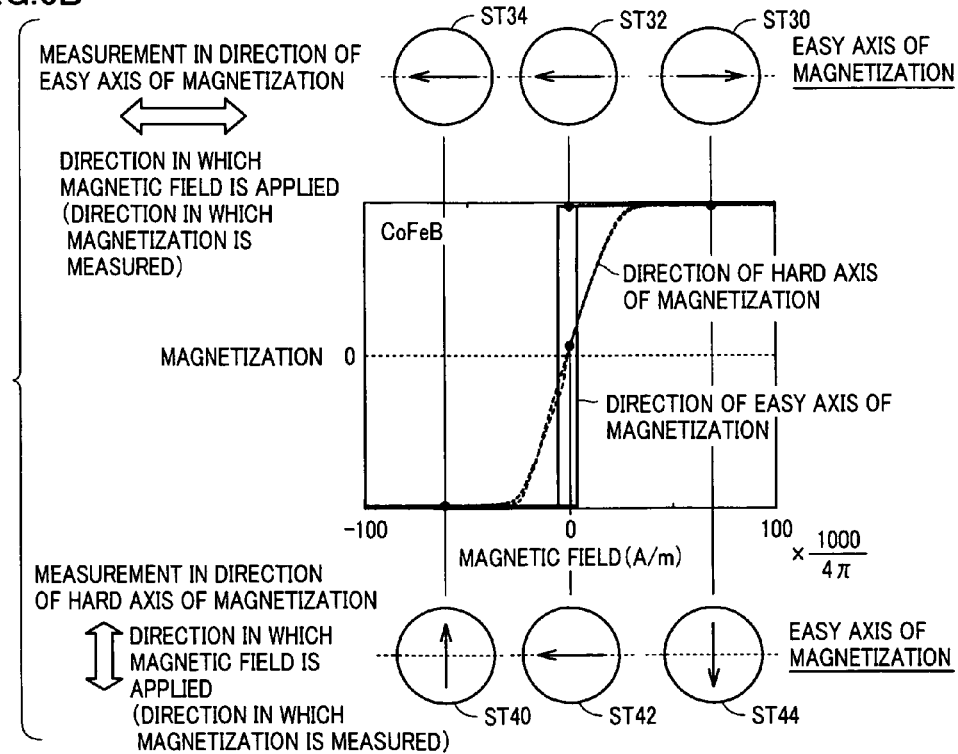
FIG. 6B is a view showing an example of a magnetization characteristic of a CoFeB alloy.

FIG. 6B shows an example of a magnetization characteristic of a CoFeB alloy.

Referring to FIG. 6A, when a variable magnetic field was applied to a ferromagnetic layer made of a CoFe alloy having uniaxial magnetic anisotropy formed by performing patterning and thermal treatment described above, in each of the direction of the easy axis of magnetization and the direction of the hard axis of magnetization, a magnetization characteristic with hysteresis was measured in each case.

Specifically, when a magnetic field oriented to the right side of the paper plane on the easy axis of magnetization is applied, the magnetization direction of the CoFe alloy is oriented to the right side of the paper plane along the easy axis of magnetization (state ST10), and when a magnetic field oriented to the left side of the paper plane on the easy axis of magnetization is applied, the magnetization direction of the CoFe alloy is oriented to the left side of the paper plane along the easy axis of magnetization (state ST14). Further, when the applied magnetic field becomes zero as it changes its direction from the right side to the left side of the paper plane, the magnetization direction of the CoFe alloy is deviated from the easy axis of magnetization (state ST12).

Similarly, when a magnetic field oriented to the upper side of the paper plane on the hard axis of magnetization is applied, the magnetization direction of the CoFe alloy is oriented to the upper side of the paper plane along the hard axis of magnetization (i.e., the direction orthogonal to the easy axis of magnetization) (state ST20), and when a magnetic field oriented to the lower side of the paper plane on the hard axis of magnetization is applied, the magnetization direction of the CoFe alloy is oriented to the lower side of the paper plane along the hard axis of magnetization (state ST24). Further, when the applied magnetic field becomes zero as it changes its direction from the upper side to the lower side of the paper plane, the magnetization direction of the CoFe alloy is deviated from the easy axis of magnetization (state ST22).

Therefore, once the ferromagnetic layer made of a CoFe alloy is subjected to the external magnetic field in the direction of the easy axis of magnetization or in the direction of the hard axis of magnetization, it may be magnetized in a direction other than the direction of the easy axis of magnetization. It means that, in tunnel junction element 100 using a CoFe alloy as ferromagnetic layer 14, the magnetization direction of recording layer RL is oriented to a direction other than the direction of the easy axis of magnetization by the external magnetic field, and the electric resistance value is changed to an intermediate value different from the electric resistance value corresponding to the value "1" or "0". Accordingly, in MRAM device 1 in which the unselected memory cell MC arranged in the same row as the selected memory cell MC is subjected to an external magnetic field from common write bit line WBL, the electric resistance value generated in the unselected memory cell MC is changed during access to the selected memory cell MC, causing a read error.

In contrast, referring to FIG. 6B, when a variable magnetic field was applied to a ferromagnetic layer made of a CoFeB alloy having uniaxial magnetic anisotropy formed by performing patterning and thermal treatment, in each of the direction of the easy axis of magnetization and the direction of the hard axis of magnetization, a magnetization characteristic with small hysteresis was measured in each case.

Specifically, when a magnetic field oriented to the right side of the paper plane on the easy axis of magnetization is applied, the magnetization direction of the CoFeB alloy is oriented to the right side of the paper plane along the easy axis of magnetization (state ST30), and when a magnetic field oriented to the left side of the paper plane on the easy axis of magnetization is applied, the magnetization direction of the CoFeB alloy is oriented to the left side of the paper plane along the easy axis of magnetization (state ST34). Further, when the applied magnetic field becomes zero as it changes its direction from the right side to the left side of the paper plane, the magnetization direction of the CoFeB alloy is oriented to the left side of the paper plane along the easy axis of magnetization (state ST32).

Similarly, when a magnetic field oriented to the upper side of the paper plane on the hard axis of magnetization is applied, the magnetization direction of the CoFeB alloy is oriented to the upper side of the paper plane along the hard axis of magnetization (state ST40), and when a magnetic field oriented to the lower side of the paper plane on the hard axis of magnetization is applied, the magnetization direction of the CoFeB alloy is oriented to the lower side of the paper plane along the hard axis of magnetization (state ST44). Further, when the applied magnetic field becomes zero as it changes its direction from the upper side to the lower side of the paper plane, the magnetization direction of the CoFeB alloy is oriented to the left side of the paper plane along the easy axis of magnetization (state ST42).

Therefore, even if the ferromagnetic layer made of a CoFeB alloy is once subjected to the external magnetic field in the direction of the easy axis of magnetization or in the direction of the hard axis of magnetization, it maintains the magnetization in the direction of the easy axis of magnetization. Consequently, in tunnel junction element 100 using a CoFeB alloy as ferromagnetic layer 14, the magnetization direction of recording layer RL can be maintained in the direction of the easy axis of magnetization irrespective of the external magnetic field.

Accordingly, in MRAM device 1 in which the unselected memory cell MC arranged in the same row as the selected memory cell MC is subjected to an external magnetic field from common write bit line WBL, the electric resistance value generated in the unselected memory cell MC is not changed, and thus a read error can be suppressed.

As described above, in the first embodiment of the present invention, a CoFeB alloy having uniaxial magnetic anisotropy higher than that of a CoFe alloy is employed as ferromagnetic layer 14 that determines the magnetization of recording layer RL. As a result, tunnel junction element 100 can have a rate of change in magnetoresistance (i.e., a ratio of the minimum electric resistance value to the maximum electric resistance value) of 70%, compared to 50% when a CoFe alloy is used.

Figure 7A:
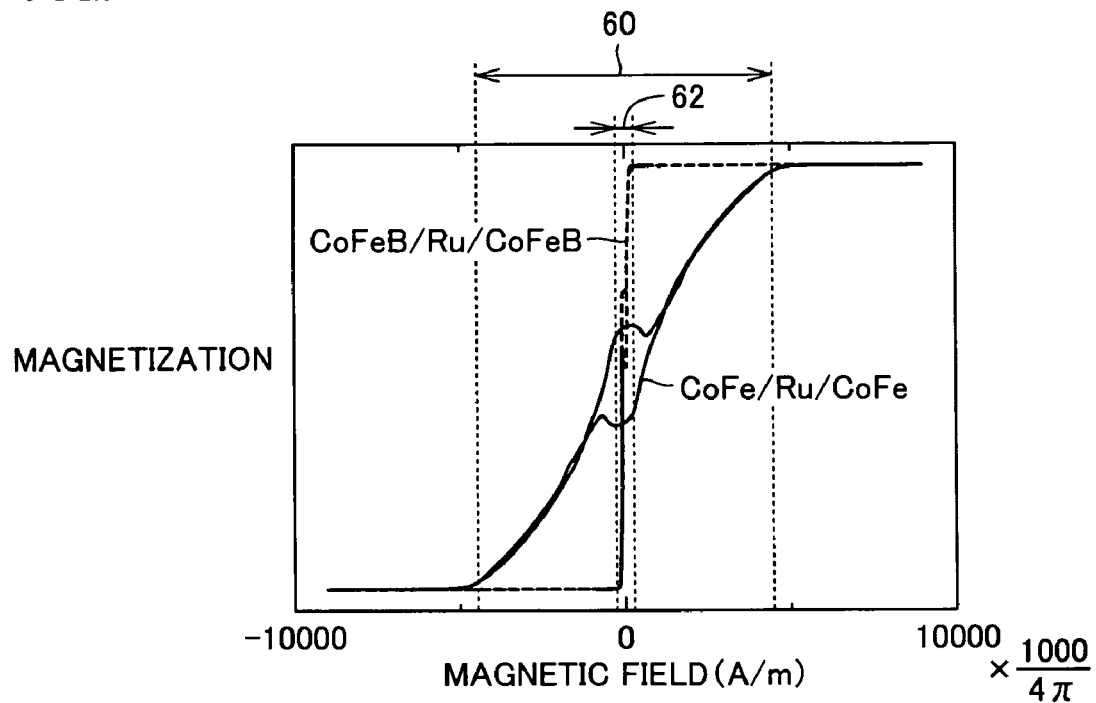
FIG. 7A is a view for illustrating characteristics of an SAF structure including a CoFe alloy and an SAF structure including a CoFeB alloy.
Figure 7B:
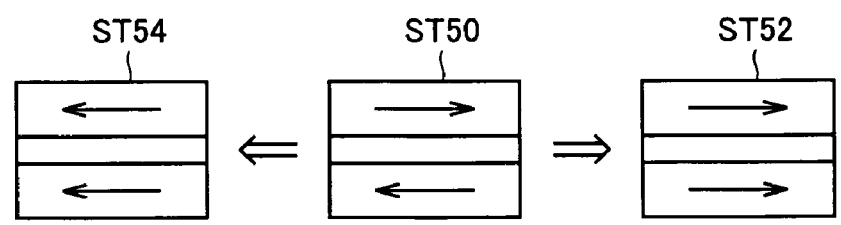
FIG. 7B is a view for illustrating characteristics of an SAF structure including a CoFe alloy and an SAF structure including a CoFeB alloy.

FIGS. 7A and 7B show characteristics of an SAF structure including a CoFe alloy and an SAF structure including a CoFeB alloy.

FIG. 7A shows exemplary magnetization characteristics of the SAF structures.

FIG. 7B is a view for illustrating magnetization states of the SAF structure.

Referring to FIG. 7A, when an SAF structure formed by sandwiching a Ru layer between CoFe alloy layers (CoFe/Ru/CoFe) and an SAF structure formed by sandwiching a Ru layer between CoFeB alloy layers (CoFeB/Ru/CoFeB) were each subjected to a variable magnetic field with saturation intensity, a magnetic field strength in which exchange-coupling is maintainable was measured.

Specifically, the SAF structure including the CoFe alloy layers (CoFe/Ru/CoFe) has an unsaturated range 60, and the SAF structure including the CoFeB alloy layers (CoFeB/Ru/CoFeB) has an unsaturated range 62.

Referring to FIG. 7B, in the unsaturated range, a state where the magnetization directions of the two ferromagnetic layers are opposite to each other (state ST50) is maintained. On the other hand, when a magnetic field exceeding the unsaturated range is applied, the magnetization directions of the two ferromagnetic layers coincide with each other (state ST52 or ST54), and a function as the SAF structure is lost. That is, it can be considered that the exchange-coupling force in the SAF structure is proportional to the size of the unsaturated range, and it is desirable to have a large unsaturated range.

Referring back to FIG. 7A, the SAF structure including the CoFeB alloy layers has an unsaturated range narrower than that of the SAF structure including the CoFe alloy layers, which means that the SAF structure including the CoFeB alloy layers has a low exchange-coupling force.

Figure 8:
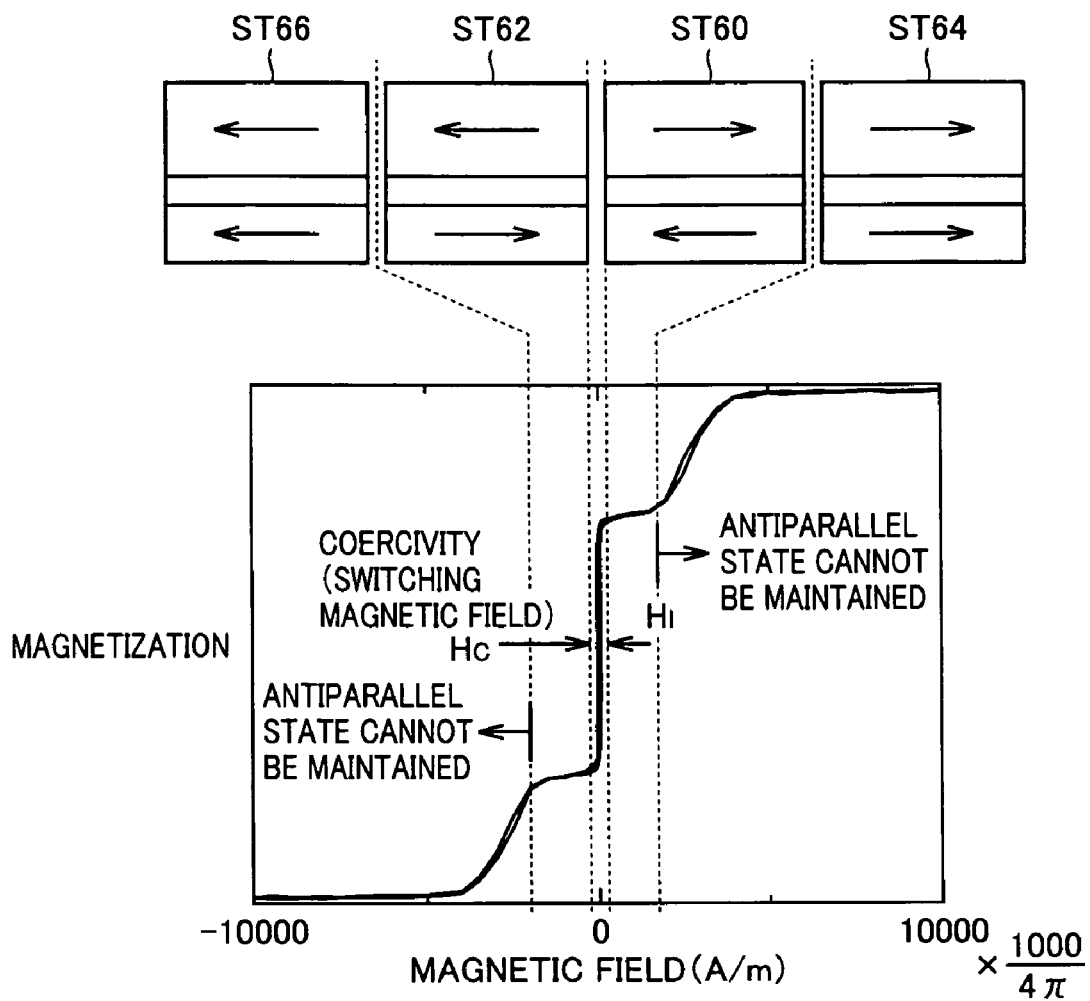
FIG. 8 is a view for illustrating an exchange-coupling force of an SAF structure.

FIG. 8 is a view for illustrating an exchange-coupling force of an SAF structure.

Referring to FIG. 8, as to a magnetization characteristic in a case where a variable magnetic field is applied to an SAF structure, when a magnetic field exceeding coercivity Hc is applied, the magnetization directions of the two ferromagnetic layers are opposite to each other (states ST60 and ST62). Specifically, when a positive magnetic field is applied, the SAF structure attains state ST60, and when a negative magnetic field is applied, the SAF structure attains state ST62.

Further, when a magnetic field exceeding the maximum magnetic field Hl is applied, the magnetization directions of the two ferromagnetic layers cannot maintain the antiparallel state, and are magnetized in a direction of the applied magnetic field. Specifically, when a positive magnetic field exceeding the maximum magnetic field Hl is applied, the SAF structure attains state ST64, and when a negative magnetic field exceeding the maximum magnetic field Hl is applied, the SAF structure attains state ST66.

Accordingly, it is desirable that a material used for ferromagnetic layers 18 and 22 of tunnel junction element 100 has the maximum magnetic field Hl, that is, the exchange-coupling force, with a value as high as possible.

As described above, in the first embodiment of the present invention, a CoFe alloy having an exchange-coupling force higher than that of a CoFeB alloy is employed as ferromagnetic layers 18 and 22 forming the SAF structure of recording layer RL. As a result, a magnitude of a switching magnetic field of tunnel junction element 100 can be decreased.

(First Modification)

Although the description has been given of the configuration in which recording layer RL is formed to be joined to insulating layer BAL at ferromagnetic layer 14 in tunnel junction element 100 in accordance with the first embodiment of the present invention, the order of stacking the layers in recording layer RL may be reversed. That is, recording layer RL may be formed to be joined to insulating layer BAL at ferromagnetic layer 22.

Figure 9:
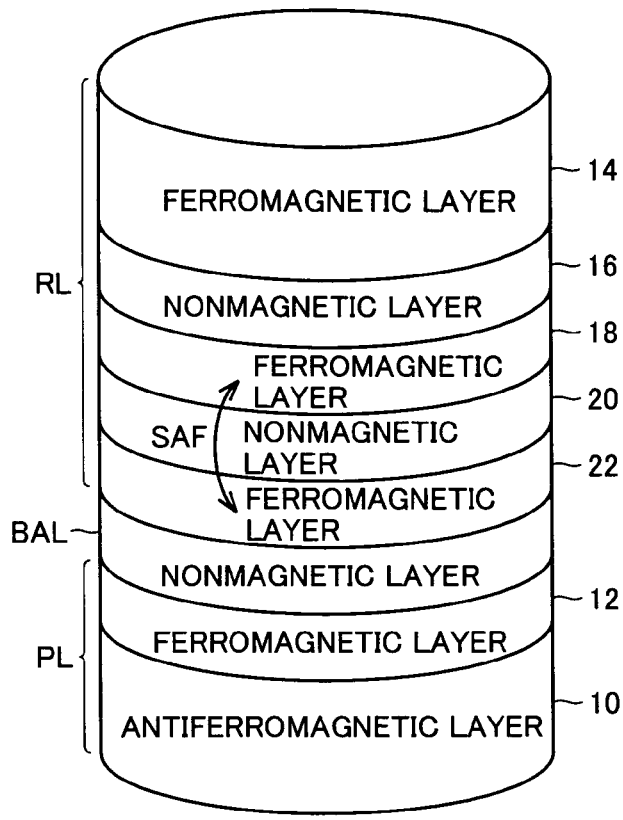
FIG. 9 is a schematic view of a tunnel junction element in accordance with a first modification of the first embodiment of the present invention.

FIG. 9 shows a schematic configuration of a tunnel junction element 101 in accordance with a first modification of the first embodiment of the present invention.

Referring to FIG. 9, tunnel junction element 101 is formed by stacking pinned layer PL, tunnel insulating layer BAL, and recording layer RL in this order.

Recording layer RL is formed by stacking ferromagnetic layer 22, nonmagnetic layer 20, ferromagnetic layer 18, nonmagnetic layer 16, and ferromagnetic layer 14 in this order, from a side joined to tunnel insulating layer BAL.

As with tunnel junction element 100 in accordance with the first embodiment of the present invention, ferromagnetic layers 18 and 22 have magnetizations oriented to such directions as to cancel each other, so that the net magnetization of ferromagnetic layers 18 and 22 is substantially zero. Specifically, ferromagnetic layers 18 and 22 form an SAF structure with nonmagnetic layer 20 interposed therebetween.

Since tunnel junction element 101 is identical to tunnel junction element 100 in accordance with the first embodiment of the present invention except for the order of stacking the layers in recording layer RL, a detailed description thereof will not be repeated.

(Second Modification)

Although the description has been given of the cylinder-shaped configuration having a circular cross section in tunnel junction element 100 in accordance with the first embodiment of the present invention, any other shape may be used as long as it has no shape anisotropy, that is, its length in the direction of the easy axis of magnetization is substantially identical to its length in the direction of the hard axis of magnetization.

Figure 10:
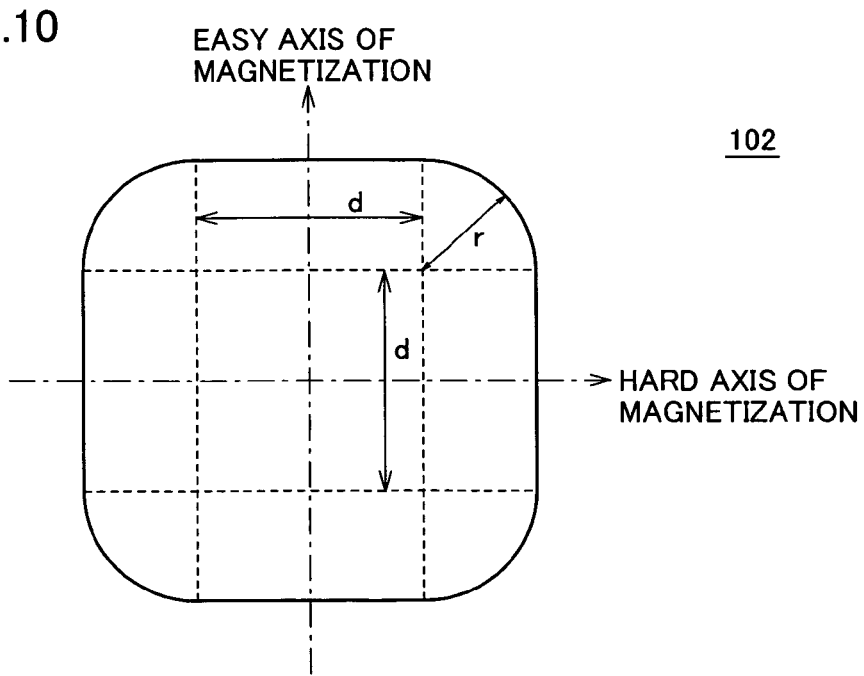
FIG. 10 is a cross sectional view of a tunnel junction element in accordance with a second modification of the first embodiment of the present invention.

FIG. 10 shows a cross section of a tunnel junction element 102 in accordance with a second modification of the first embodiment of the present invention.

Referring to FIG. 10, tunnel junction element 102 has a cross section in the shape of a square with four corners thereof changed to arcs identical to one another.

As an example, a linear portion has a length d of 50 nm, and an arc portion has a radius r of 50 nm.

Since tunnel junction element 102 is identical to tunnel junction element 100 in accordance with the first embodiment of the present invention except for the shape of the cross section, a detailed description thereof will not be repeated.

According to the first embodiment of the present invention, a tunnel junction element includes a pinned layer having a fixed magnetization direction, and a recording layer having a magnetization direction changed according to an external magnetic field. The recording layer includes two ferromagnetic layers made of a CoFe alloy forming an SAF structure, and a ferromagnetic layer made of a CoFeB alloy. Since the two ferromagnetic layers forming the SAF structure cancel magnetizations thereof each other, the magnetization of the entire recording layer is determined by the ferromagnetic layer made of a CoFeB alloy. Therefore, uniaxial magnetic anisotropy as the recording layer can be improved by using a CoFeB alloy having high uniaxial magnetic anisotropy, and a magnitude of a switching magnetic field of the recording layer can be decreased by forming an SAF structure with two ferromagnetic layers made of a CoFe alloy having a high exchange-coupling force.

Further, according to the first embodiment of the present invention, high uniaxial magnetic anisotropy is obtained, and thus an MRAM device with stable selectivity of a memory cell during data write and improved error margin during data read can be implemented.

Further, according to the first embodiment of the present invention, a magnitude of a switching magnetic field of the recording layer can be decreased, and thus an MRAM device that suppresses power consumption during data write can be implemented.

Second Embodiment

In the first embodiment described above, the description has been given of the case where one ferromagnetic layer determining uniaxial magnetic anisotropy of the recording layer is provided. In a second embodiment, a description will be given of a case where two ferromagnetic layers determining uniaxial magnetic anisotropy of the recording layer are provided.

Figure 11:
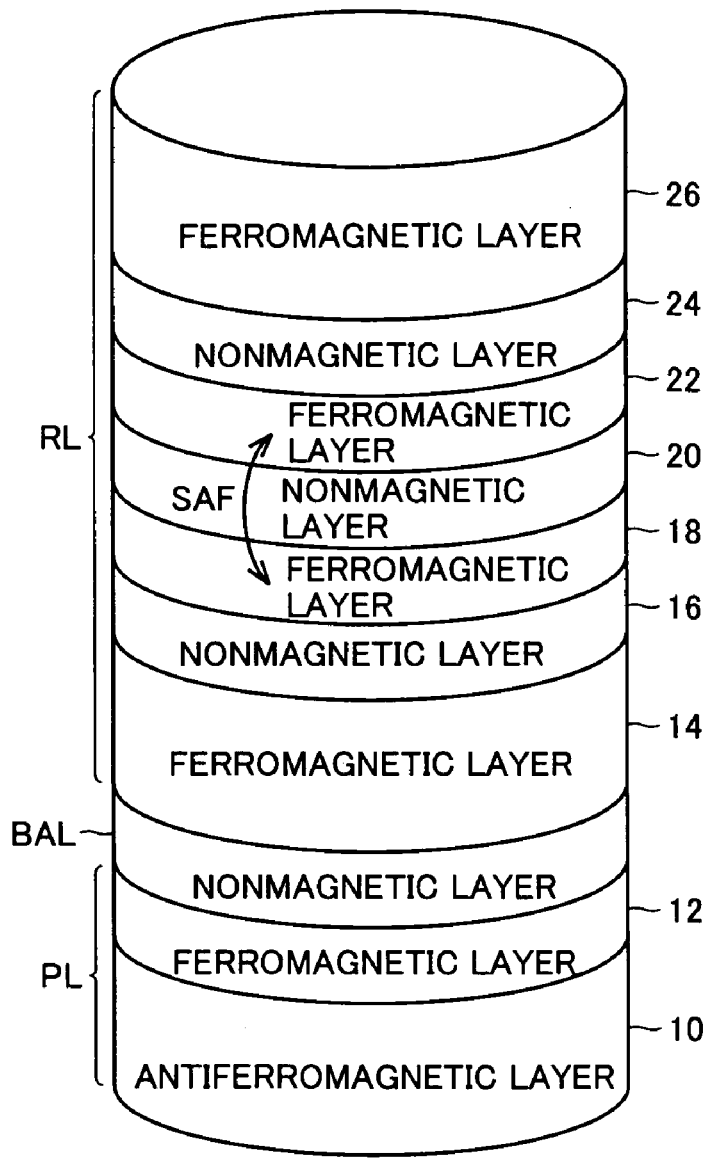
FIG. 11 is a schematic appearance view of a tunnel junction element in accordance with a second embodiment of the present invention.

FIG. 11 shows a schematic appearance of a tunnel junction element 103 in accordance with the second embodiment of the present invention.

Referring to FIG. 11, tunnel junction element 103 in accordance with the second embodiment of the present invention is formed by adding a nonmagnetic layer 24 and a ferromagnetic layer 26 to recording layer RL of tunnel junction element 100 in accordance with the first embodiment of the present invention shown in FIG. 2A.

As with nonmagnetic layers 16 and 20, nonmagnetic layer 24 is made of Ru, Cu, Ta, or the like. In the second embodiment of the present invention, nonmagnetic layer 24 is made of Ru, for example.

Ferromagnetic layer 26 is made of a metal material containing Co, Fe, Ni, or the like as a main component, such as a CoFe alloy, a Co, Fe or CoNi alloy, a CoFeNi alloy, or the like. In the second embodiment of the present invention, ferromagnetic layer 26 is made of a NiFe alloy, for example.

Layer thicknesses of ferromagnetic layers 14 and 26 are selected to satisfy the following expression (1):

$$M1 \times t1 \neq M2 \times t2 \quad (1),$$

where t1 and t2 represent layer thicknesses of ferromagnetic layers 14 and 26, respectively, and M1 and M2 represent saturation magnetizations of ferromagnetic layers 14 and 26, respectively.

In the first embodiment of the present invention, for example, ferromagnetic layer 14 has a layer thickness of 2 nm, ferromagnetic layer 26 has a layer thickness of 6 nm, ferromagnetic layers 18 and 22 each have a layer thickness of 2.5 nm, and nonmagnetic layers 16, 20, and 26 each have a layer thickness of 1.0 nm.

As for the rest, tunnel junction element 103 is identical to tunnel junction element 100 in accordance with the first embodiment of the present invention, and thus a detailed description thereof will not be repeated.

Figure 12A:
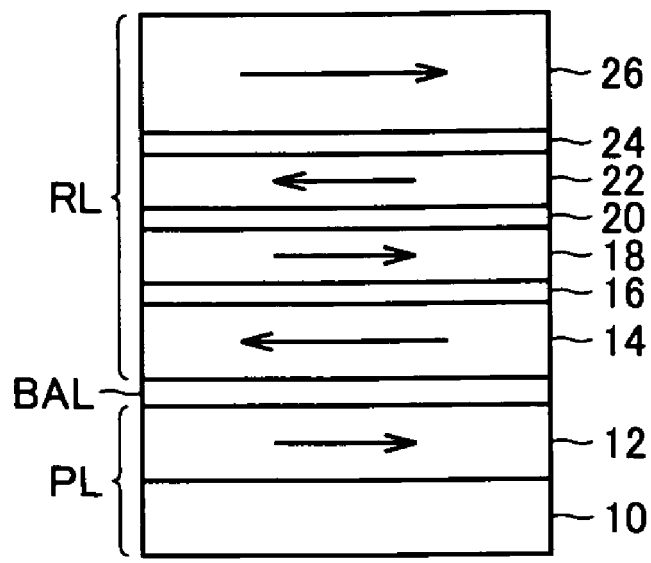
FIG. 12A is a view showing magnetization directions of respective layers when the tunnel junction element stores a value "0".
Figure 12B:
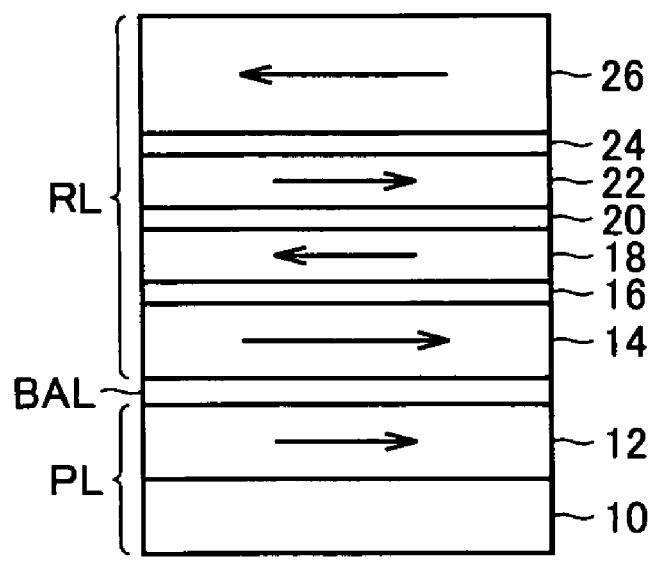
FIG. 12B is a view showing magnetization directions of respective layers when the tunnel junction element stores a value "1".

FIGS. 12A and 12B show magnetization directions of respective layers when tunnel junction element 103 stores data.

FIG. 12A shows a case where a value "0" is stored.

FIG. 12B shows a case where a value "1" is stored.

As with the first embodiment of the present invention, in the second embodiment of the present invention, the value "0" is stored to correspond to a case where the magnetization direction of recording layer RL is antiparallel (i.e., in a direction opposite) to the magnetization direction of pinned layer PL. Further, the value "1" is stored to correspond to a case where the magnetization direction of recording layer RL is parallel (i.e., in a direction identical) to the magnetization direction of pinned layer PL.

Referring to FIG. 12A, in the case where tunnel junction element 103 stores the value "0", if the magnetization direction of pinned layer PL is oriented to the right side of the paper plane, the magnetization direction of ferromagnetic layer 14 arranged on a side opposite to pinned layer PL with tunnel insulating layer BAL interposed therebetween is oriented to the left side of the paper plane. The magnetization direction of ferromagnetic layer 18 arranged on a side opposite to ferromagnetic layer 14 with nonmagnetic layer 16 interposed therebetween is oriented to the right side of the paper plane. Further, the magnetization direction of ferromagnetic layer 22 forming the SAF structure together with ferromagnetic layer 18 is oriented to the left side of the paper plane, and the magnitude of the magnetization thereof substantially coincides with the magnitude of the magnetization of ferromagnetic layer 18. Furthermore, the magnetization direction of ferromagnetic layer 26 arranged on a side opposite to ferromagnetic layer 22 with nonmagnetic layer 24 interposed therebetween is oriented to the right side of the paper plane. Therefore, as the entire recording layer RL, the magnetizations of ferromagnetic layers 18 and 22 cancel each other, and the magnetizations of ferromagnetic layers 14 and 26 appear.

Referring to FIG. 12B, in the case where tunnel junction element 103 stores the value "1", the magnetization directions of ferromagnetic layers 14, 18, 22, and 26 are opposite to the magnetization directions in the above case where the value "0" is stored, respectively. That is, the magnetization directions of ferromagnetic layers 14 and 22 are oriented to the right side of the paper plane, and the magnetization directions of ferromagnetic layers 18 and 26 are oriented to the left side of the paper plane. Therefore, as the entire recording layer RL, the magnetization direction thereof is oriented to the direction of synthetic magnetization of ferromagnetic layers 14 and 26.

Since the net magnetization of ferromagnetic layers 18 and 22 forming the SAF structure is substantially zero as described above, the magnetization of recording layer RL in accordance with the second embodiment of the present invention is determined by the magnetizations of ferromagnetic layers 14 and 26. That is, ferromagnetic layers 14 and 26 determine a switching magnetic field of recording layer RL in accordance with the second embodiment of the present invention.

A switching magnetic field Hsw is given by the following expression (2), using t1 and t2 representing the layer thicknesses and M1 and M2 representing saturation magnetizations described above:

$$Hsw=2\times(Ku1\times t1+Ku2\times t2)/|M2\times t2-M1\times t1| \quad (2),$$

where Ku1 and Ku2 represent magnetic anisotropy energies of ferromagnetic layers 14 and 26, respectively.

It can be seen from expression (2) that the switching magnetic field of recording layer RL is determined by a combination of ferromagnetic layers 14 and 26. That is, uniaxial magnetic anisotropy of recording layer RL can achieve a desired characteristic by appropriately selecting materials and layer thicknesses of ferromagnetic layers 14 and 26.

As described above, in the second embodiment of the present invention, a NiFe alloy having a switching magnetic field lower in magnitude than that of a CoFeB alloy is used as ferromagnetic layer 26, and thus recording layer RL having a switching magnetic field further lower than that of recording layer RL including single ferromagnetic layer 14 made of a CoFeB alloy can be implemented.

According to the second embodiment of the present invention, the magnetization characteristic of the recording layer can be designed more freely, in addition to the effect obtained in the first embodiment of the present invention. Thereby, a tunnel junction element having higher uniaxial magnetic anisotropy and further suppressing a switching magnetic field can be implemented. Consequently, an MRAM device with more stable selectivity of a memory cell during data write and further improved error margin during data read can be implemented.

Third Embodiment

In the first and the second embodiments described above, the description has been given of the case where the recording layer includes one SAF structure. In a third embodiment, a description will be given of a case where the recording layer includes two SAF structures.

Figure 13:
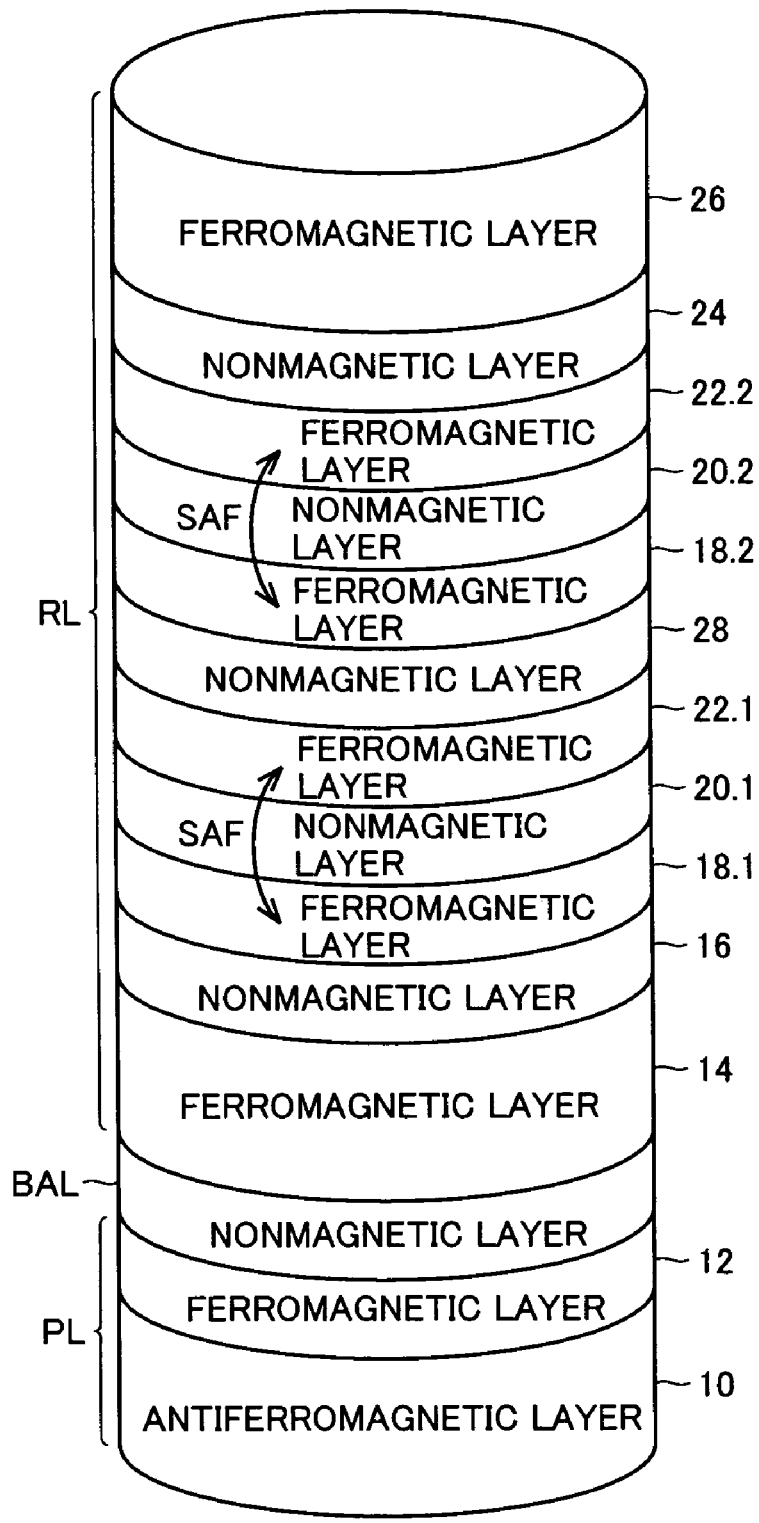
FIG. 13 is a schematic appearance view of a tunnel junction element in accordance with a third embodiment of the present invention.

FIG. 13 shows a schematic appearance of a tunnel junction element 104 in accordance with the third embodiment of the present invention.

Referring to FIG. 13, tunnel junction element 104 in accordance with the third embodiment of the present invention is formed by replacing ferromagnetic layer 18, nonmagnetic layer 20, and ferromagnetic layer 22 in recording layer RL of tunnel junction element 103 in accordance with the second embodiment of the present invention shown in FIG. 11 with ferromagnetic layer 18.1, nonmagnetic layer 20.1, ferromagnetic layer 22.1, nonmagnetic layer 28, ferromagnetic layer 18.2, nonmagnetic layer 20.2, and ferromagnetic layer 22.2.

Ferromagnetic layer 18.1, nonmagnetic layer 20.1, and ferromagnetic layer 22.1, and ferromagnetic layer 18.2, nonmagnetic layer 20.2, and ferromagnetic layer 22.2 are similar to ferromagnetic layer 18, nonmagnetic layer 20, and ferromagnetic layer 22 in recording layer RL in accordance with the first embodiment of the present invention, respectively, and each group forms an SAF structure.

Specifically, ferromagnetic layers 18.1 and 22.1 have magnetizations oriented to such directions as to cancel each other, so that the net magnetization of ferromagnetic layers 18.1 and 22.1 is substantially zero. Similarly, ferromagnetic layers 18.2 and 22.2 have magnetizations oriented to such directions as to cancel each other, so that the net magnetization of ferromagnetic layers 18.2 and 22.2 is substantially zero.

Ferromagnetic layers 18.1 and 22.1 and ferromagnetic layers 18.2 and 22.2 are each made of a metal material containing Co, Fe, Ni, or the like as a main component, such as a CoFe alloy, a Co, Fe or CoNi alloy, a CoFeNi alloy, or the like. In the third embodiment of the present invention, ferromagnetic layers 18.1, 18.2, 22.1, and 22.2 are each made of a CoFe alloy, for example. Ferromagnetic layers 18.1 and 22.1 are formed to have the same layer thickness, and ferromagnetic layers 18.2 and 22.2 are also formed to have the same layer thickness. It is not necessary for all of ferromagnetic layers 18.1, 22.1, 18.2, and 22.2 to have the same layer thickness, and the layer thickness of ferromagnetic layers 18.1 and 22.1 may be different from the layer thickness of ferromagnetic layers 18.2 and 22.2.

Nonmagnetic layers 20.1, 20.2, and 28 are made of Ru, Cu, Ta, or the like. In the third embodiment of the present invention, nonmagnetic layers 20.1, 20.2, and 28 are made of Ru, for example.

In the third embodiment of the present invention, for example, ferromagnetic layer 14 has a layer thickness of 2 nm, ferromagnetic layer 26 has a layer thickness of 5 nm, ferromagnetic layers 18.1, 18.2, 22.1, and 22.2 each have a layer thickness of 2.5 nm, and nonmagnetic layers 16, 20.1, 20.2, and 26 each have a layer thickness of 0.8 nm.

Ferromagnetic layers 18.1 and 22.1 and nonmagnetic layer 20.1, and ferromagnetic layers 18.2 and 22.2 and nonmagnetic layer 20.2 correspond to the "exchange-coupling layers".

As for the rest, tunnel junction element 104 is identical to tunnel junction element 103 in accordance with the second embodiment of the present invention, and thus a detailed description thereof will not be repeated.

Figure 14A:
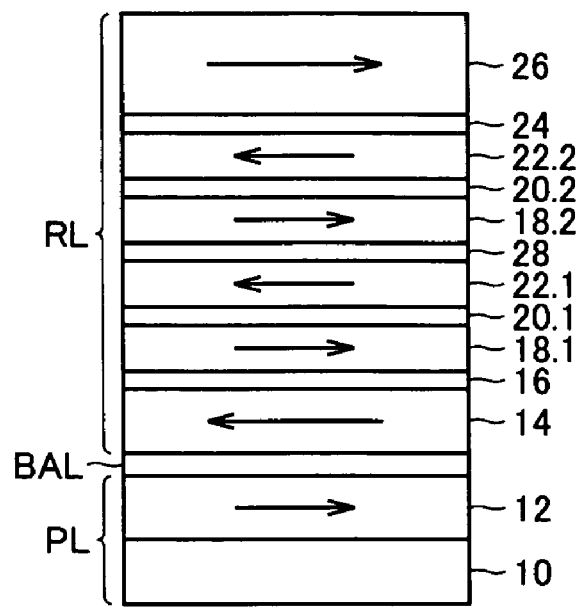
FIG. 14A is a view showing magnetization directions of respective layers when the tunnel junction element stores a value "0".
Figure 14B:
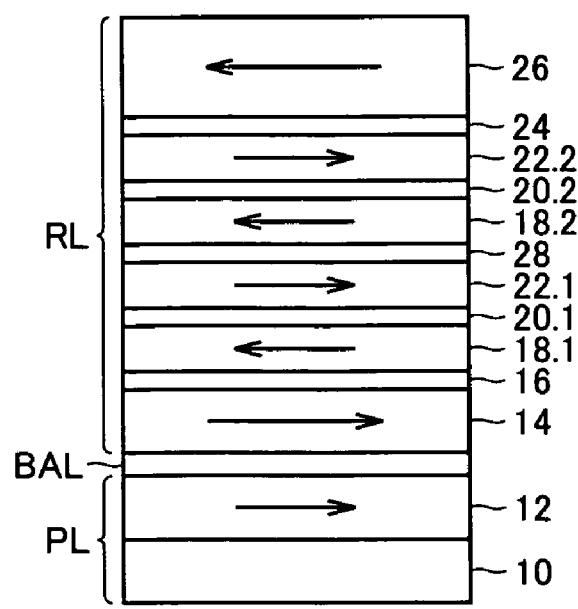
FIG. 14B is a view showing magnetization directions of respective layers when the tunnel junction element stores a value "1".

FIGS. 14A and 14B show magnetization directions of respective layers when tunnel junction element 104 stores data.

FIG. 14A shows a case where a value "0" is stored.

FIG. 14B shows a case where a value "1" is stored.

As with the first embodiment of the present invention, in the third embodiment of the present invention, the value "0" is stored to correspond to a case where the magnetization direction of recording layer RL is antiparallel (i.e., in a direction opposite) to the magnetization direction of pinned layer PL. Further, the value "1" is stored to correspond to a case where the magnetization direction of recording layer RL is parallel (i.e., in a direction identical) to the magnetization direction of pinned layer PL.

Referring to FIG. 14A, in the case where tunnel junction element 104 stores the value "0", if the magnetization direction of pinned layer PL is oriented to the right side of the paper plane, the magnetization direction of ferromagnetic layer 14 arranged on a side opposite to pinned layer PL with tunnel insulating layer BAL interposed therebetween is oriented to the left side of the paper plane. The magnetization direction of ferromagnetic layer 18.1 arranged on a side opposite to ferromagnetic layer 14 with nonmagnetic layer 16 interposed therebetween is oriented to the right side of the paper plane. Further, the magnetization direction of ferromagnetic layer 22.1 forming the SAF structure together with ferromagnetic layer 18.1 is oriented to the left side of the paper plane, and the magnitude of the magnetization thereof substantially coincides with the magnitude of the magnetization of ferromagnetic layer 18.1.

The magnetization direction of ferromagnetic layer 18.2 arranged on a side opposite to ferromagnetic layer 22.1 with nonmagnetic layer 28 interposed therebetween is oriented to the right side of the paper plane. Further, the magnetization direction of ferromagnetic layer 22.2 forming the SAF structure together with ferromagnetic layer 18.2 is oriented to the left side of the paper plane, and the magnitude of the magnetization thereof substantially coincides with the magnitude of the magnetization of ferromagnetic layer 18.2.

The magnetization direction of ferromagnetic layer 26 arranged on a side opposite to ferromagnetic layer 22.2 with nonmagnetic layer 24 interposed therebetween is oriented to the right side of the paper plane. Therefore, as the entire recording layer RL, the magnetizations of ferromagnetic layers 18.1 and 22.1 cancel each other and the magnetizations of ferromagnetic layers 18.2 and 22.2 cancel each other, and thus the magnetizations of ferromagnetic layers 14 and 26 appear.

Referring to FIG. 14B, in the case where tunnel junction element 104 stores the value "1", the magnetization directions of ferromagnetic layers 14, 18.1, 22.1, 18.2, 22.2, and 26 are opposite to the magnetization directions in the above case where the value "0" is stored, respectively. That is, the magnetization directions of ferromagnetic layers 14, 22.1, and 22.2 are oriented to the right side of the paper plane, and the magnetization directions of ferromagnetic layers 18.1, 18.2, and 26 are oriented to the left side of the paper plane. Therefore, as the entire recording layer RL, the magnetization thereof is oriented to the direction of synthetic magnetization of ferromagnetic layers 14 and 26.

As described above, since ferromagnetic layer 18.1 and ferromagnetic layer 22.1 form an SAF structure, and ferromagnetic layer 18.2 and ferromagnetic layer 22.2 form an SAF structure, an exchange-coupling force generated in recording layer RL can be increased.

According to the third embodiment of the present invention, the number of the SAF structures included in the recording layer can be increased, and exchange-coupling forces of the respective SAF structures can be synthesized to obtain a higher exchange-coupling force, in addition to the effects obtained in the first and the second embodiments of the present invention. Thereby, a switching magnetic field can be further decreased, and an MRAM device that further suppresses power consumption during data write can be implemented.

Other Embodiments

In the description of the first to the third embodiments of the present invention, the tunnel junction element utilizing the tunnel magnetoresistive effect has been described as an example of a magnetoresistive element. The present invention is also applicable to a magnetoresistive element utilizing the giant magnetoresistive effect.

In the description of the first to the third embodiments of the present invention, the configuration in which pinned layer PL, tunnel insulating layer BAL, and recording layer RL have the same cross sectional shape has been described. It is not always necessary for these layers to have the same cross sectional shape, and for example, pinned layer PL and tunnel insulating layer BAL may have a cross sectional shape larger than that of pinned layer PL and recording layer RL.

Further, in the description of the first to the third embodiments of the present invention, the configuration in which a CoFeB alloy is used for ferromagnetic layer 14 of recording layer RL and a CoFe alloy is used for ferromagnetic layers 18, 18.1, 18.2 and 22, 22.1, 22.2 has been described. The present invention is not limited to these materials, and it is needless to say that two types of materials can be selected as appropriate from the viewpoints described above. Furthermore, although the description has been given of the thicknesses of the respective layers, it is needless to say that the thicknesses can be designed as appropriate for an MRAM device to which the present invention is applied.

The embodiments disclosed herein are by way of example in all respects and should not be interpreted as restrictive. The scope of the present invention is determined not by the above description but by the appended claims, and intended to include all the modifications within the meaning and the scope equivalent to those of the claims.

The invention claimed is:

1. A nonvolatile memory device, comprising:
a plurality of write lines provided in rows and columns; and
a magnetoresistive element arranged to correspond to an intersection of two write lines corresponding to a row and a column among said plurality of write lines, said magnetoresistive element storing data by being subjected to a write magnetic field generated by currents flowing through said respective two write lines according to write data, and changing an electric resistance value in a nonvolatile manner,
said magnetoresistive element including
a pinned layer having a fixed magnetization direction irrespective of said write magnetic field,
a recording layer having a magnetization direction changeable according to said write magnetic field, and
a first nonmagnetic layer sandwiched between said pinned layer and said recording layer,
said recording layer including
an exchange-coupling layer,
a first ferromagnetic layer made of a first material, and
a second nonmagnetic layer sandwiched between said exchange-coupling layer and said first ferromagnetic layer,
said exchange-coupling layer including
second and third ferromagnetic layers made of a second material different from said first material, and
a third nonmagnetic layer sandwiched between said second ferromagnetic layer and said third ferromagnetic layer,
said second and third ferromagnetic layers having magnetizations oriented opposite to each other and substantially identical in magnitude to cancel each other.

2. The nonvolatile memory device according to claim 1, wherein said second material contains one or more of cobalt, iron, and nickel.

3. The nonvolatile memory device according to claim 2, wherein said second material is a cobalt-iron alloy.

4. The nonvolatile memory device according to claim 1, wherein said first material contains one or more of cobalt, iron, and nickel, and boron.

5. The nonvolatile memory device according to claim 4, wherein said first material is a cobalt-iron alloy containing boron.

6. The nonvolatile memory device according to claim 1, wherein at least one of said first, second, and third nonmagnetic layers is ruthenium.

7. The nonvolatile memory device according to claim 1, wherein
said recording layer is arranged such that said first ferromagnetic layer is joined to said first nonmagnetic layer, and further includes
a fourth ferromagnetic layer, and
a fourth nonmagnetic layer sandwiched between said exchange-coupling layer and said fourth ferromagnetic layer, said fourth ferromagnetic layer having a magnetization direction opposite to a magnetization direction of said first ferromagnetic layer.

8. The nonvolatile memory device according to claim 7, wherein said fourth ferromagnetic layer contains one or more of cobalt, iron, and nickel.

9. The nonvolatile memory device according to claim 8, wherein said fourth ferromagnetic layer is a nickel-iron alloy.

10. The nonvolatile memory device according to claim 1, wherein said recording layer includes a plurality of said exchange-coupling layers.

11. The nonvolatile memory device according to claim 1, wherein said recording layer is formed with an external magnetic field applied thereto, and thereafter subjected to thermal treatment with an external magnetic field applied thereto, and thereby a direction for easy magnetization is determined.

* * * * *